United States Patent
Kang et al.

(10) Patent No.: US 10,622,292 B2
(45) Date of Patent: Apr. 14, 2020

(54) HIGH DENSITY INTERCONNECTS IN AN EMBEDDED TRACE SUBSTRATE (ETS) COMPRISING A CORE LAYER

(71) Applicant: QUALCOMM Incorporated, San Diego, CA (US)

(72) Inventors: Kuiwon Kang, San Diego, CA (US); Houssam Jomaa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/189,128

(22) Filed: Nov. 13, 2018

(65) Prior Publication Data
US 2020/0013706 A1  Jan. 9, 2020

Related U.S. Application Data
(60) Provisional application No. 62/694,839, filed on Jul. 6, 2018.

(51) Int. Cl.
H01L 23/31 (2006.01)
H01L 23/498 (2006.01)
H01L 21/48 (2006.01)

(52) U.S. Cl.
CPC ...... *H01L 23/49822* (2013.01); *H01L 21/486* (2013.01); *H01L 21/4857* (2013.01); *H01L 23/49827* (2013.01); *H01L 23/49838* (2013.01)

(58) Field of Classification Search
CPC .... H01L 23/49838; H01L 24/29; H01L 24/83
See application file for complete search history.

(56) References Cited

U.S. PATENT DOCUMENTS

| | | | |
|---|---|---|---|
| 2001/0020739 A1 | 9/2001 | Honda | |
| 2014/0301058 A1 | 10/2014 | Sunohara et al. | |
| 2015/0250053 A1 | 9/2015 | Oi et al. | |
| 2015/0279893 A1* | 10/2015 | Kao | H01L 27/14636 257/459 |
| 2016/0020163 A1 | 1/2016 | Shimizu et al. | |
| 2016/0172299 A1* | 6/2016 | Noveski | H01L 24/17 257/737 |
| 2018/0350731 A1 | 12/2018 | Hu | |

OTHER PUBLICATIONS

International Search Report and Written Opinion—PCT/US2019/038734—ISA/EPO—Oct. 17, 2019.

* cited by examiner

*Primary Examiner* — Thomas L Dickey
(74) *Attorney, Agent, or Firm* — Loza & Loza, LLP/Qualcomm

(57) ABSTRACT

A substrate that includes a first substrate portion, a second substrate portion and a second dielectric layer. The first substrate portion includes a core layer having a first core surface, and a plurality of core substrate interconnects, wherein the plurality of core substrate interconnects includes a plurality of surface core substrate interconnects formed over the first surface of core layer. The second substrate portion includes a first dielectric layer having a first dielectric surface, the first dielectric surface facing the first core surface of the core layer, and a plurality of substrate interconnects, wherein the plurality of substrate interconnects includes a plurality of interconnects formed over the first dielectric surface. The second dielectric layer is formed between the first substrate portion and the second substrate portion such that the plurality of surface core substrate interconnects and the plurality of substrate interconnects are located in the second dielectric layer.

30 Claims, 29 Drawing Sheets

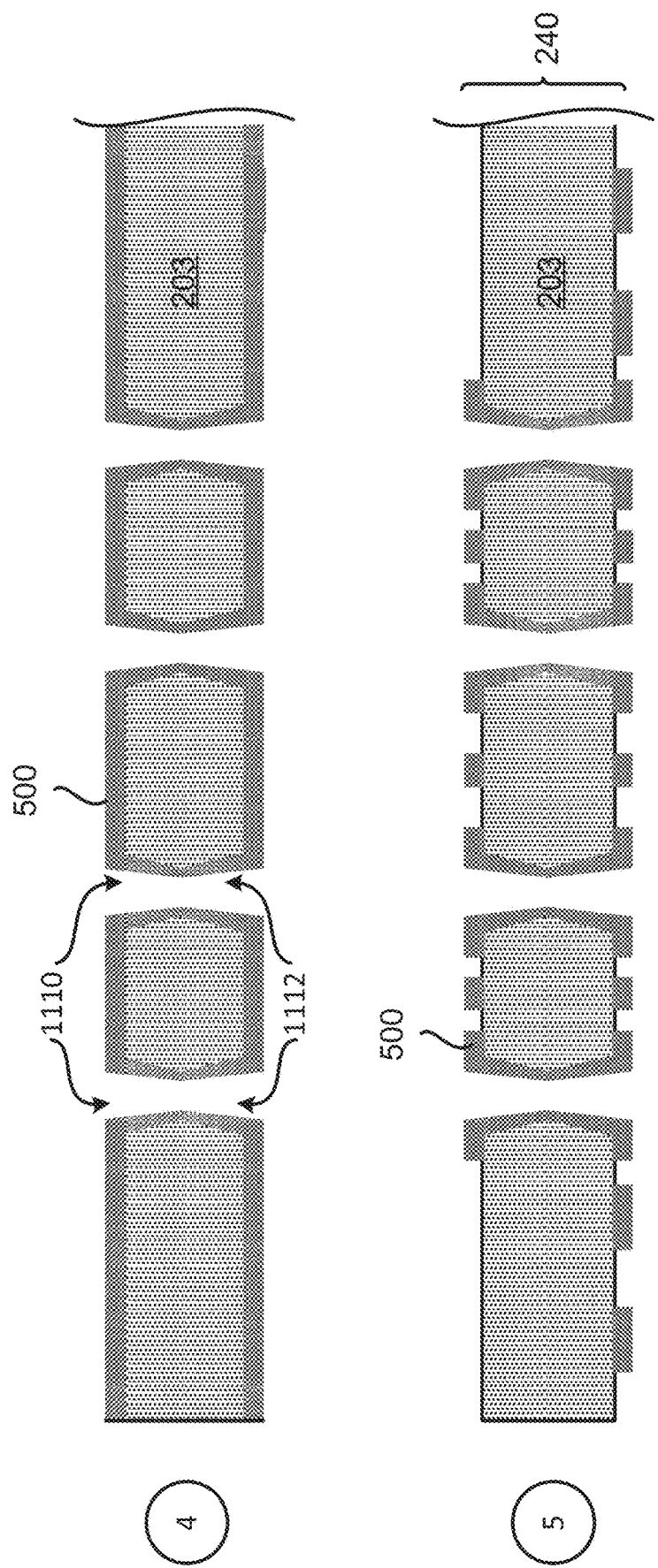

HIGH DENSITY INTERCONNECTS IN AN EMBEDDED TRACE SUBSTRATE (ETS) COMPRISING A CORE LAYER

CROSS-REFERENCE TO RELATED APPLICATION(S)

This application claims priority to and the benefit of Provisional Application No. 62/694,839, filed in the U.S. Patent and Trademark Office on Jul. 6, 2018, the entire contents of which is incorporated herein by reference as if fully set forth below in their entirety and for all applicable purpose.

BACKGROUND

Field

Various features relate to substrates for integrated devices, but more specifically to high density interconnects in embedded traces substrates (ETS) that include a core layer.

Background

FIG. 1 illustrates an integrated device 100 that includes a substrate 102 and a die 104. The die 104 is coupled to the substrate 102 through a plurality of solder interconnects 140. The integrated device 100 is designed to be used in small portable devices, such as mobile devices. The substrate 102 may be an embedded trace substrate (ETS), which is designed and fabricated for devices with small footprints, such as mobile devices. Similarly, the die 104 may be designed and fabricated for use in mobile devices.

The substrate 102 includes a plurality of dielectric layers 120 and a plurality of interconnects 122. Each layer of the dielectric layers 120 includes a patterned metal layer and vias. The substrate 102 includes a first solder resist layer 124, a second solder resist layer 126, and a plurality of solder interconnects 130. The substrate 102 is a coreless substrate. Because of the process used for fabricating the substrate 102, the substrate 102 and the integrated device 100 are not designed for devices that are larger than mobile devices. While an embedded trace substrate (ETS) may be suitable to be used in mobile devices or devices with small footprints, embedded trace substrates (ETS) are not suitable for larger devices, such as devices used in automotive vehicles. Redesigning a die that was initially designed for mobile devices, so that it can be used in automotive vehicles can be very expensive, and thus not cost effective.

Therefore, there is a need for providing an integrated device that can be implemented in larger devices, such as an automotive vehicle, without having to redesign the die. Ideally, such a device may use a die that was designed for mobile devices, but can be used in vehicles (e.g., automotive application).

SUMMARY

Various features relate to substrates for integrated devices, but more specifically to high density interconnects in embedded traces substrates (ETS) that include a core layer.

One example provides an integrated device that includes a die and a substrate coupled to the die. The substrate that includes a core substrate portion, a coreless substrate portion and a second dielectric layer. The core substrate portion includes a core layer having a first core surface, and a plurality of core substrate interconnects, each core substrate interconnect having a first minimum width, wherein the plurality of core substrate interconnects includes a plurality of surface core substrate interconnects formed over the first surface of core layer. The coreless substrate portion includes a first dielectric layer having a first dielectric surface, the first dielectric surface facing the first core surface of the core layer, and a plurality of substrate interconnects, each substrate interconnect having a second minimum width, the second minimum width is less than the first minimum width, wherein the plurality of substrate interconnects includes a plurality of interconnects formed over the first dielectric surface. The second dielectric layer is formed between the core substrate portion and the coreless substrate portion such that the plurality of surface core substrate interconnects and the plurality of substrate interconnects are located in the second dielectric layer.

Another example provides a substrate that includes a first substrate portion, a second substrate portion and a second dielectric layer. The first substrate portion includes a core layer having a first core surface, and a plurality of core substrate interconnects, each core substrate interconnect having a first minimum width, wherein the plurality of core substrate interconnects includes a plurality of surface core substrate interconnects formed over the first core surface of the core layer. The second substrate portion includes a first dielectric layer having a first dielectric surface, the first dielectric surface facing the first core surface of the core layer, and a plurality of substrate interconnects, each substrate interconnect having a second minimum width, the second minimum width is less than the first minimum width, wherein the plurality of substrate interconnects includes a plurality of interconnects formed over the first dielectric surface. The second dielectric layer is formed between the first substrate portion and the second substrate portion such that the plurality of surface core substrate interconnects and the plurality of substrate interconnects are located in the second dielectric layer.

Another example provides a method for fabricating a substrate. The method provides a core substrate, the core substrate includes (i) a core layer having a first core surface; and (ii) a plurality of core substrate interconnects, each core substrate interconnect having a first minimum width, wherein the plurality of core substrate interconnects includes a plurality of surface core substrate interconnects formed over the first core surface of the core layer. The method provides a second dielectric layer over the core substrate. The method provides an embedded trace substrate (ETS) over the second dielectric layer and the core substrate such that the second dielectric layer is between the core substrate and the ETS. The ETS includes (i) a first dielectric layer having a first dielectric surface, the first dielectric surface facing the first core surface of the core layer; and (ii) a plurality of substrate interconnects, each substrate interconnect having a second minimum width, the second minimum width is less than the first minimum width. The plurality of substrate interconnects includes a plurality of interconnects formed over the first dielectric surface. The plurality of surface core substrate interconnects and the plurality of substrate interconnects are located in the second dielectric layer.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a substrate that includes a first substrate portion, a second substrate portion, and a second dielectric layer. The first substrate portion may be core substrate. The first substrate portion includes a core layer having a first core surface, and a plurality of core substrate interconnects, each core substrate interconnect having a first minimum width, wherein the plurality of core substrate interconnects includes a plurality of surface core substrate interconnects formed over the first surface of the core layer. The second substrate portion may be coreless substrate, such as an embedded trace substrate (ETS). The second substrate portion includes a first dielectric layer having a first dielectric surface, the first dielectric surface facing the first core surface of the core layer, and a plurality of substrate interconnects. Each substrate interconnect has a second minimum width. The second minimum width is less than the first minimum width. The plurality of substrate interconnects includes a plurality of interconnects formed over the first dielectric surface. The second dielectric layer is formed between the first substrate portion and the second substrate portion such that the plurality of surface core substrate interconnects and the plurality of substrate interconnects are located in the second dielectric layer. In some implementations, the substrate is part of an integrated device implemented in a vehicle (e.g., automobile). In some implementations, the substrate is part of a device (e.g., integrated device) that includes a die, where the die is designed for mobile devices.

Exemplary Device Comprising Embedded Trace Substrate (ETS) with a Core Layer

Figure 1:
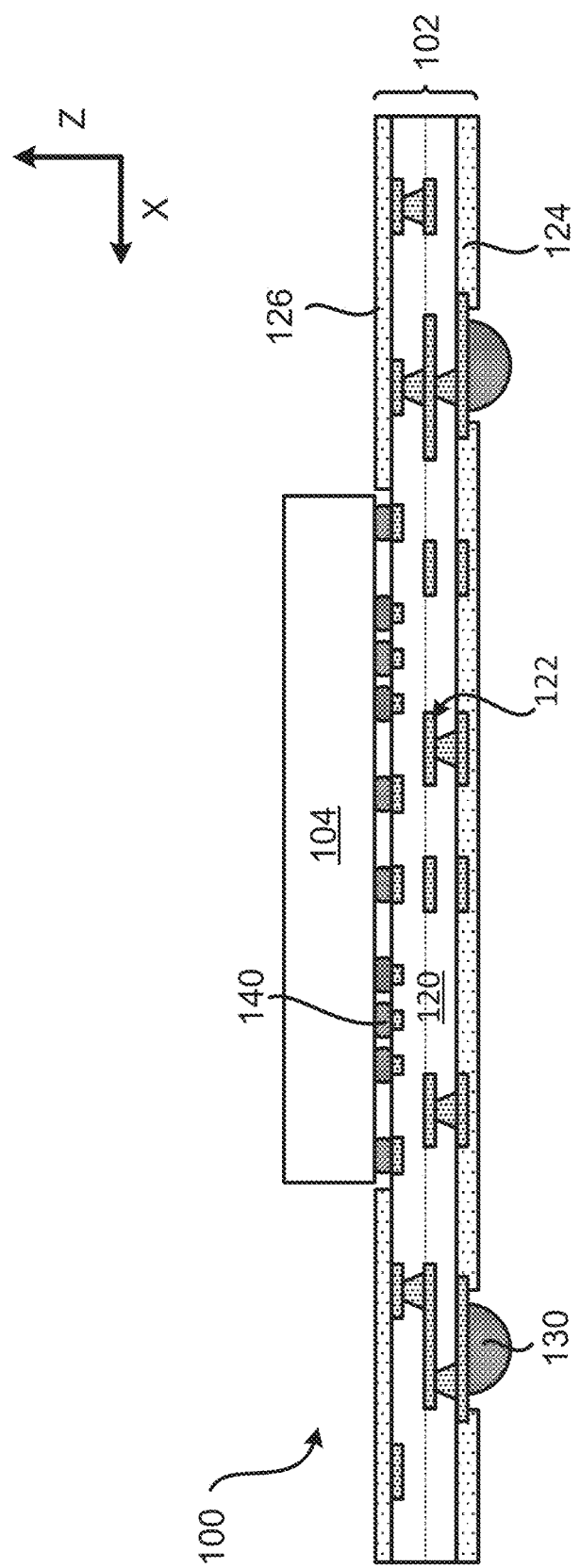
FIG. 1 illustrates a profile view of a device that includes a die and a substrate.
Figure 2:
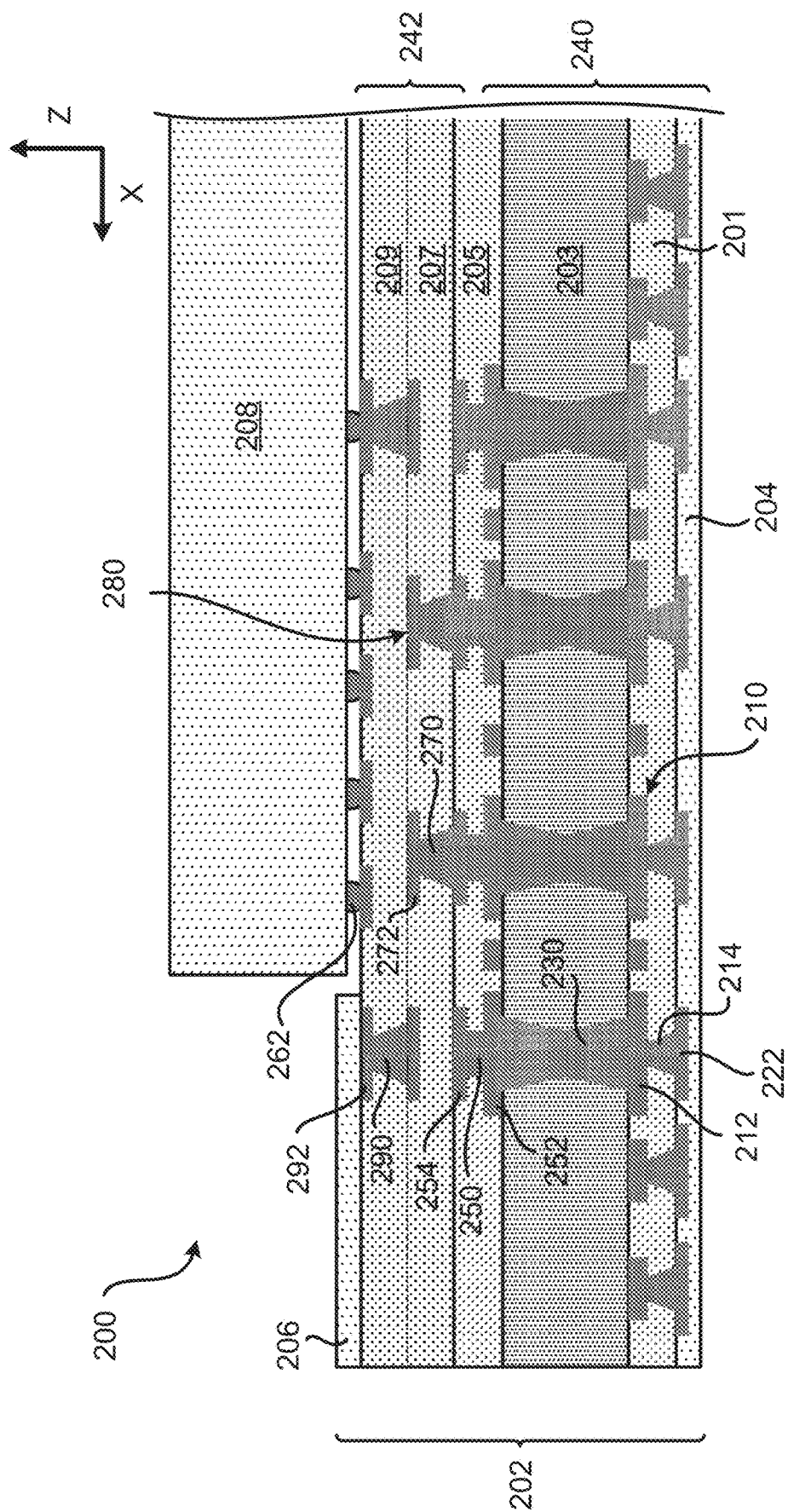
FIG. 2 illustrates a profile view of a package that includes a die and an embedded trace substrate (ETS) with a core layer.

FIG. 2 illustrates a profile view of a device 200 that includes a substrate 202 and a die 208. The device 200 may be an integrated device that is implemented in a vehicle (e.g., automobile, truck, motorcycle). The die 208 may have high density bump interconnects. For example, the die 208 may have bump interconnects that have a pitch in a range of 0.35-0.4 millimeters (mm). The die 208 may be initially designed to be implemented in a mobile device. A die that is designed for mobile devices may have low voltage and/or current requirements. Devices that are larger than mobile devices, such as devices in automotive vehicles, may operate at higher voltages and/or current than mobile devices.

As will be further described below, a first surface of the substrate 202 (e.g., surface facing the die 208) may have a first plurality of bump interconnects that may have a pitch in a range of 0.35-0.4 millimeters (mm), and a second surface of the substrate 202 (e.g., surface facing away from the die 208, surface opposite to the first surface of the substrate) may have a second plurality of bump interconnects that may have a pitch in a range of 0.7-0.8 millimeters (mm).

The substrate 202 includes a first substrate portion 240 (e.g., core substrate portion), and a second substrate portion 242 (e.g., coreless substrate portion). The first substrate portion 240 may be a core substrate, and the second substrate portion may be an embedded trace substrate (ETS). The second substrate portion 242 may be a coreless substrate. The first substrate portion 240 is coupled to the second substrate portion 242 through a dielectric layer 205 (e.g., second dielectric layer). As will be further described below, the dielectric layer 205 includes two patterned metal layers, a patterned metal layer from the first substrate portion 240 and a patterned metal layer from the second substrate portion 242. In some implementations, the patterned metal layer of the first substrate portion 240 defines a plurality of interconnects for the first substrate portion 240, and the patterned metal layer of the second substrate portion 242 defines a plurality of interconnects for the second substrate portion 242.

The first substrate portion 240 includes a core layer 203, a dielectric layer 201, and a plurality of core substrate interconnects 210 (e.g., core pad, core trace, core via). The first substrate portion 240 may be a core substrate. The plurality of core substrate interconnects 210 includes a pad 222, a via 214, a pad 212, a core via 230, and a pad 252. Some of the plurality of core substrate 210 may be surface core substrate interconnects. For example, a plurality of surface core substrate interconnects may include the pad 212, the pad 252, the pad 612, the pad 622, the pad 812, the pad 822 and/or any interconnect (e.g., pad, trace) formed over a surface (e.g., first core surface, second core surface) of the core layer 203. The core via 230 travels through the core layer 203. As shown in FIG. 2, the core via 230 includes non-vertical walls (e.g., diagonal walls, angled wall). In some implementations, each of the core substrate interconnect from the plurality of core substrate interconnects 210 has a minimum width of 15 micrometers (μm), and a minimum spacing between neighboring core substrate interconnects of 10 micrometers (μm). The plurality of core substrate interconnects 210 may be fabricated using a semi-addictive process (SAP) or a modified semi-addictive process (mSAP).

The plurality of core substrate interconnects 210 may include a second plurality of bump interconnects that have a pitch in a range of 0.7-0.8 millimeters (mm). The second plurality of bump interconnects may include pads (e.g., pad 222) formed over the dielectric layer 201. The second plurality of bump interconnects may be coupled to a plurality of solder interconnects (e.g., solder balls (not shown)).

The second substrate portion 242 includes a dielectric layer 207, a dielectric layer 209, a plurality of substrate interconnects 280 (e.g., substrate pad, substrate trace, substrate via). The dielectric layer 207 may be a first dielectric layer. The second substrate portion 242 may be a coreless substrate (e.g., embedded trace substrate (ETS)).

The plurality of substrate interconnects 280 includes a substrate pad 254, a substrate via 270, a substrate pad 272, a substrate via 290, and a substrate pad 292. Each dielectric layer of the second substrate portion 242 includes one patterned metal layer and a plurality of vias. The dielectric layer 207 may include a first dielectric surface that faces a first core surface of the core layer 203. A plurality of interconnects may be formed over the first dielectric surface of the dielectric layer 207. For example, the substrate pad 254 (e.g., interconnect) is formed over the first dielectric surface of the dielectric layer 207 (e.g., first dielectric layer). The substrate pad 254 may be part of a patterned metal layer for the dielectric layer 207. Similarly, the dielectric layer 209 includes the substrate pad 292, which is part of a patterned metal layer for the dielectric layer 209. In some implementations, each of the substrate interconnect from the plurality of substrate interconnects 280 has a minimum width of 6 micrometers (μm), and a minimum spacing between neighboring substrate interconnects of 8 micrometers (μm).

The plurality of substrate interconnects 280 may include a first plurality of bump interconnects that may have a pitch in a range of 0.35-0.4 millimeters (mm). The first plurality of bump interconnects may include pads (e.g., substrate pad 292) formed in the dielectric layer 209. The first plurality of bump interconnects may be coupled to a plurality of solder interconnects 262 (e.g., solder), which is coupled to the die 208. The plurality of solder interconnects 262 may be part of interconnects (e.g., pillars, copper pillars) that couple the die 208 to the substrate 202.

A dielectric layer 205 (e.g., second dielectric layer) is coupled and located between the first substrate portion 240 (e.g., core substrate) and the second substrate portion 242 (e.g., coreless substrate, embedded trace substrate (ETS)). The dielectric layer 205 may be a single dielectric layer. The dielectric layer 205 is coupled to the core layer 203 of the first substrate portion 240, and the dielectric layer 207 of the second substrate portion 242.

The dielectric layer 205 is formed between the first substrate portion 240 and the second substrate portion 242 such that some of core substrate interconnects (e.g., pad 252) from the plurality of core substrate interconnects 210, and some substrate interconnects (e.g., pad 254) from the plurality of substrate interconnects 280 are located in the dielectric layer 205. Thus, as shown in FIG. 2, the dielectric layer 205 includes two patterned metal layers, one patterned metal layer from the first substrate portion 240 and one patterned metal layer from the second substrate portion 242.

The dielectric layer 205 also includes a plurality of vias 250 that are coupled to the plurality of core substrate interconnects 210 and the plurality of substrate interconnects 280.

As will be further described below, the first substrate portion 240, the dielectric layer 205 and the second substrate portion 242 may be coupled together (e.g., laminated together) to form the substrate 202. The process allows a first plurality of bump interconnects (e.g., interconnects that are coupled to solder) to have a pitch in a range of 0.35-0.4 millimeters (mm), and a second plurality of bump interconnects to have a pitch in a range of 0.7-0.8 millimeters (mm). The overall thickness of the core layer 203 may be in a range of 150-250 micrometers (μm). In some implementations, the overall thickness of the substrate 202 may be in a range of 150-1200 micrometers (μm). FIG. 2 illustrates a second substrate portion 242 that includes 3 metal layers. However, it is noted that different implementations may use substrate portions with different metal layers (e.g., 2 metal layers) and/or or different numbers of dielectric layers. Different implementations may use a core layer with different thicknesses. For example, different substrates in the present disclosure may have a core layer 203 that may have an overall thickness in a range of 150-1200 micrometers (μm).

Figure 4:
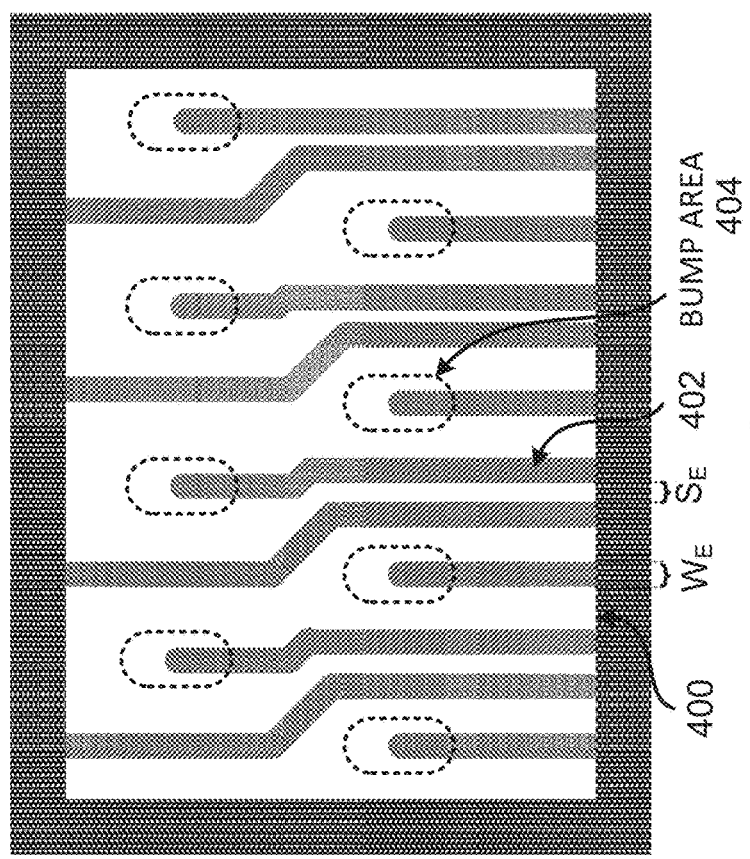
FIG. 4 illustrates a plan view of a bump portion of an embedded trace substrate (ETS).
Figure 3:
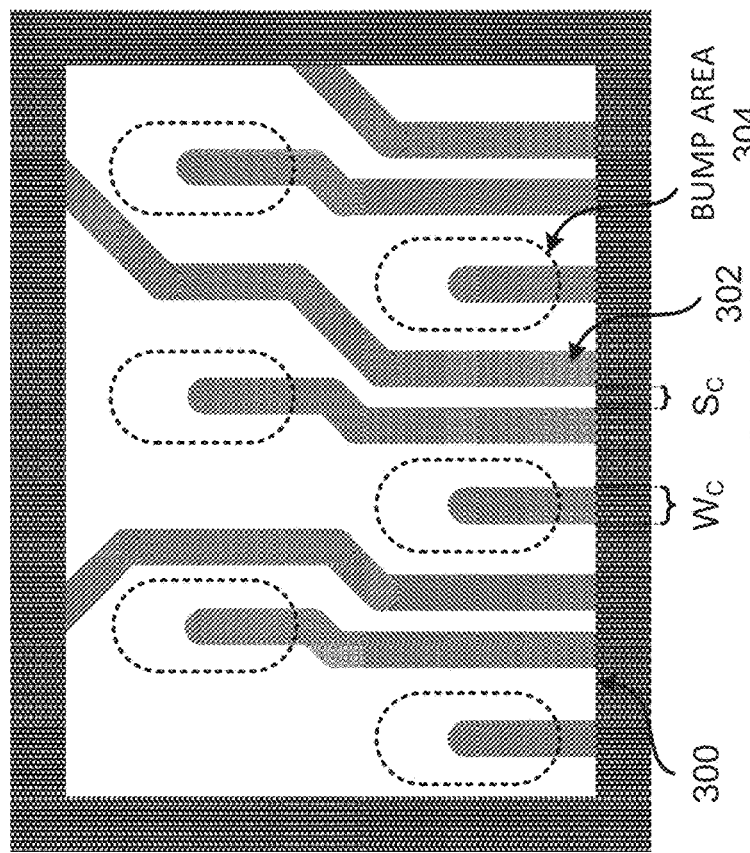
FIG. 3 illustrates a plan view of a bump portion of a core substrate.

FIGS. 3 and 4 illustrate exemplary plan views of different portions of the substrate 202. FIG. 3 illustrates a plan view of a portion 300 of the first substrate portion 240 and FIG. 4 illustrates a plan view of a portion 400 of the second substrate portion 242. The plan views of FIGS. 3 and 4 may represent views along one or more X-Y planes of the substrate.

FIG. 3 may illustrate interconnects formed in and/or over the dielectric layer 201. The portion 300 includes a plurality of interconnects 302 (e.g., core substrate interconnects) and a plurality of bump areas 304. The bump areas 304 may be areas of the substrate 202 that is coupled to solder interconnects (e.g., solder balls, ball grid array (BGA)). The portion 300 may be a portion of the first substrate portion 240 that faces away from a die coupled to the substrate 202. The bump areas may 304 have a pitch in a range of 0.7-0.8 millimeters (mm). In some implementations, the plurality of interconnects 302 have minimum width ($W_C$) values of 15 micrometers (μm), minimum spacing ($S_C$) values of 10 micrometers (μm), and minimum pitch values of 25 micrometers (μm).

FIG. 4 may illustrate interconnects formed in and/or over the dielectric layer 209. The portion 400 includes a plurality of interconnects 402 (e.g., core interconnects) and a plurality of bump areas 404. The bump areas 404 may be areas of the substrate 202 that is coupled to the solder interconnects of a die (e.g., 208). The portion 400 may be a portion of the second substrate portion 242 that faces a die (e.g., 208) that is coupled to the substrate 202. The bump areas may have a pitch in a range of 0.35-0.4 millimeters (mm). In some implementations, the plurality of interconnects 402 have minimum width ($W_E$) values of 6 micrometers (μm), minimum spacing ($S_E$) values of 8 micrometers (μm), and minimum pitch values of 14 micrometers (μm).

FIGS. 3 and 4 illustrate that the first substrate portion 240 includes interconnects and bump areas that have minimum width, minimum spacing and/or minimum pitch that are greater than the minimum width, minimum spacing and/or minimum pitch of interconnects and bump areas of the second substrate portion 242.

In some implementations, the above configuration of the substrate allows dies that are configured for mobile applications to be used in automotive applications, without having the redesign the die. The substrate can be designed to accommodate the spacing, pitch and interconnect density requirements of the die, while also accommodating the spacing, pitch, and interconnect density requirements of larger devices, such as devices in vehicles. For examples, dies for mobile devices have higher density interconnects because of their fine interconnect width, spacing and pitch, while devices larger than mobile devices, have interconnects that have higher minimum width, spacing, and pitch interconnect requirements. In some implementations, the disclosed substrate may be fabricated using the disclosed processes, which enable substrates with different minimum width, spacing and pitch interconnects designs for different portions of the substrate.

Having described a substrate that includes different minimum width, spacing and pitch interconnects designs for different portions of the substrate, methods for fabricating the disclosed substrates will now be described below.

Exemplary Sequence for Fabricating an Embedded Trace Substrate (ETS) with a Core Layer In some implementations, fabricating a substrate includes several processes. FIG. 5 (which includes FIGS. 5A-5D) illustrates an exemplary sequence for providing or fabricating a substrate (e.g., embedded trace substrate (ETS) with a core layer). In some implementations, the sequence of FIGS. 5A-5D may be used to provide or fabricate the substrate 202 of FIG. 2, other substrates, and/or other devices described in the disclosure.

It should be noted that the sequence of FIGS. 5A-5D may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Figure 5A:
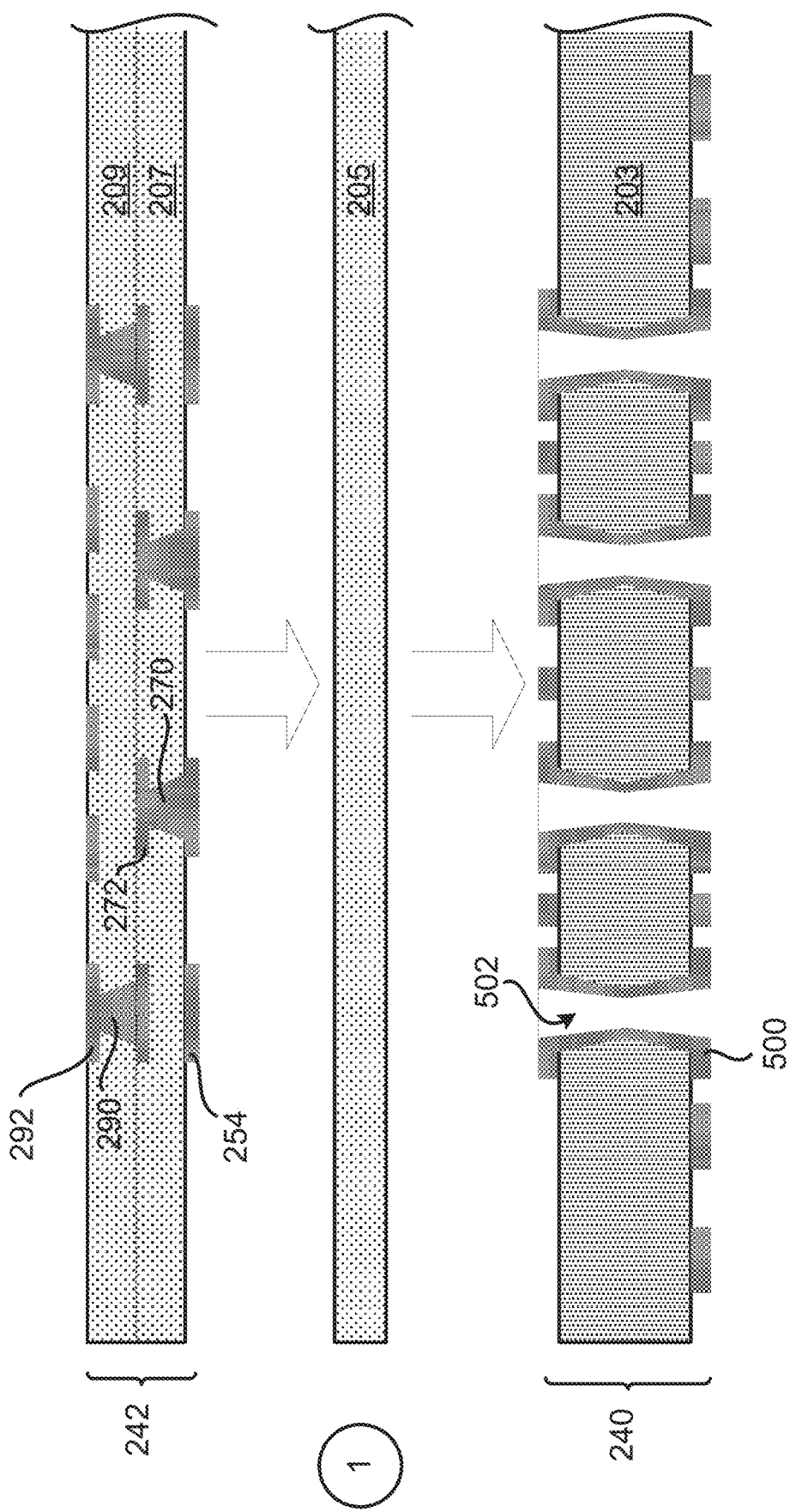
FIG. 5 (comprising FIGS. 5A-5D) illustrates an exemplary sequence for fabricating a substrate that includes an embedded trace substrate (ETS) with a core layer.

Stage 1, as shown in FIG. 5A, illustrates a second substrate portion 242 being coupled to a first substrate portion 240 such that a dielectric layer 205 is between the first substrate portion 240 and the second substrate portion 242. A lamination process may be used to couple the first substrate portion 240, the dielectric layer 205 and the second substrate portion 242. In some implementations, the first substrate portion 240 includes a core layer 203 and a plurality of cavities 502 that travel through the core layer 203. The first substrate portion 240 includes at least one patterned metal layer 500 over the surfaces of the first substrate portion 240. The at least one patterned metal layer 500 may define interconnects (e.g., core substrate interconnects) for the first substrate portion 240, as described in FIG. 2. For example, the at least one patterned metal layer 500 may define the pad 252, via 230 and the pad 212. The at least one patterned metal layer 500 may include a seed layer. The core layer 203 may include different dielectric materials, such a silicon, glass, quartz, epoxy, or combinations thereof. The core layer 203 of the first substrate portion 240 may have a thickness in a range of 150-250 micrometers (μm). The dielectric layer 205 may include dry film, such as Ajinomoto dry film (ABF) and/or prepreg. The dielectric layer 207 and/or the dielectric layer 209 may include polyimide.

Figure 5B:
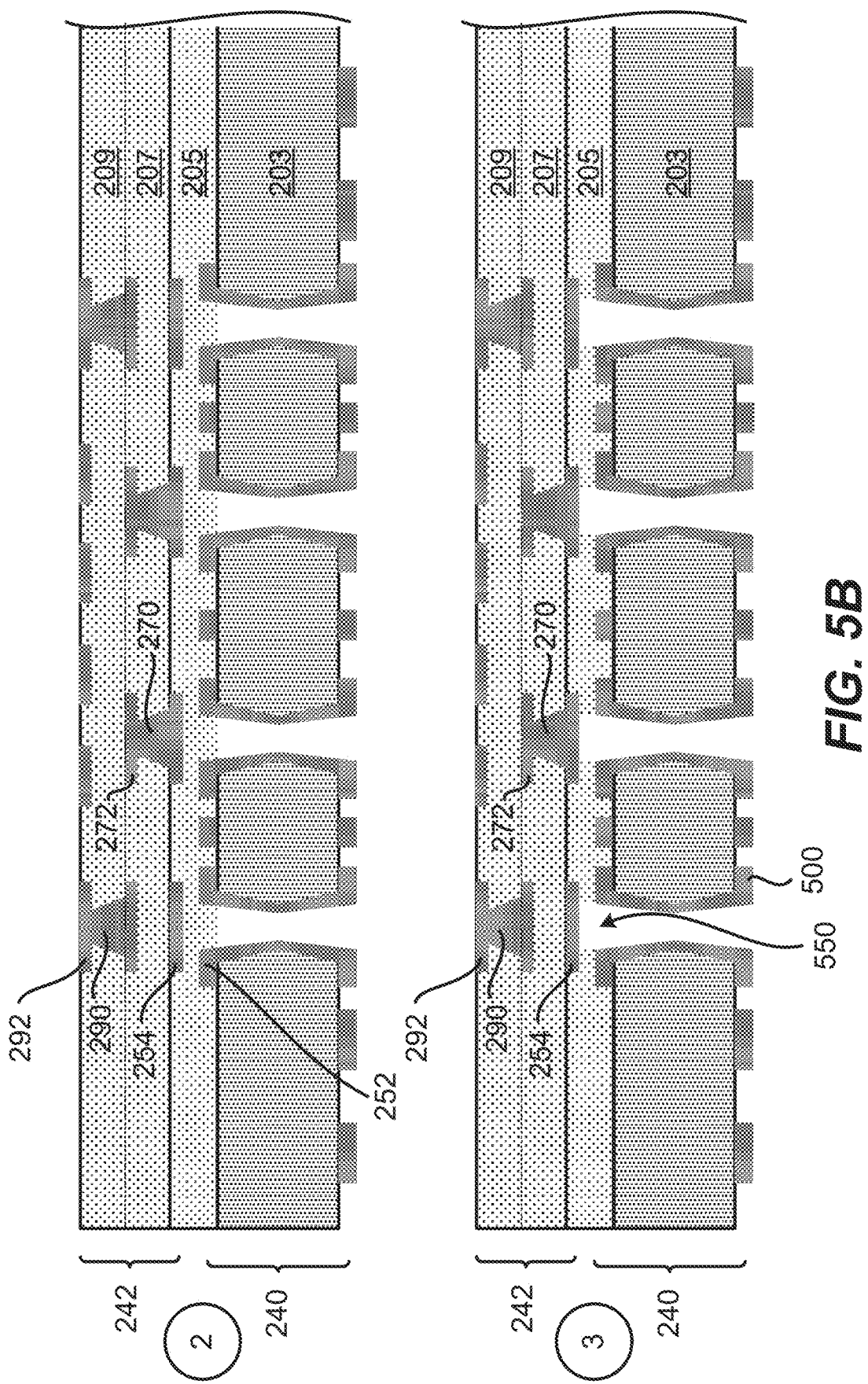

Stage 2, as shown in FIG. 5B, illustrates a state after the second substrate portion 242 has been coupled to the first substrate portion 240 through the dielectric layer 205. A lamination process may be used to couple the first substrate portion 240, the dielectric layer 205 and the second substrate portion 242. The dielectric layer 205 encapsulates some interconnects (e.g., pad 252) from the first substrate portion 240 and some interconnects (e.g., pad 254) from the second substrate portion 242.

Stage 3 illustrates a state after cavities 550 are formed in the dielectric layer 205. Different implementations may use different processes for forming the cavities. In some implementations, a laser etching process is used to form the cavities. In some implementations, a photolithography process may be used to form the cavities.

Figure 5C:
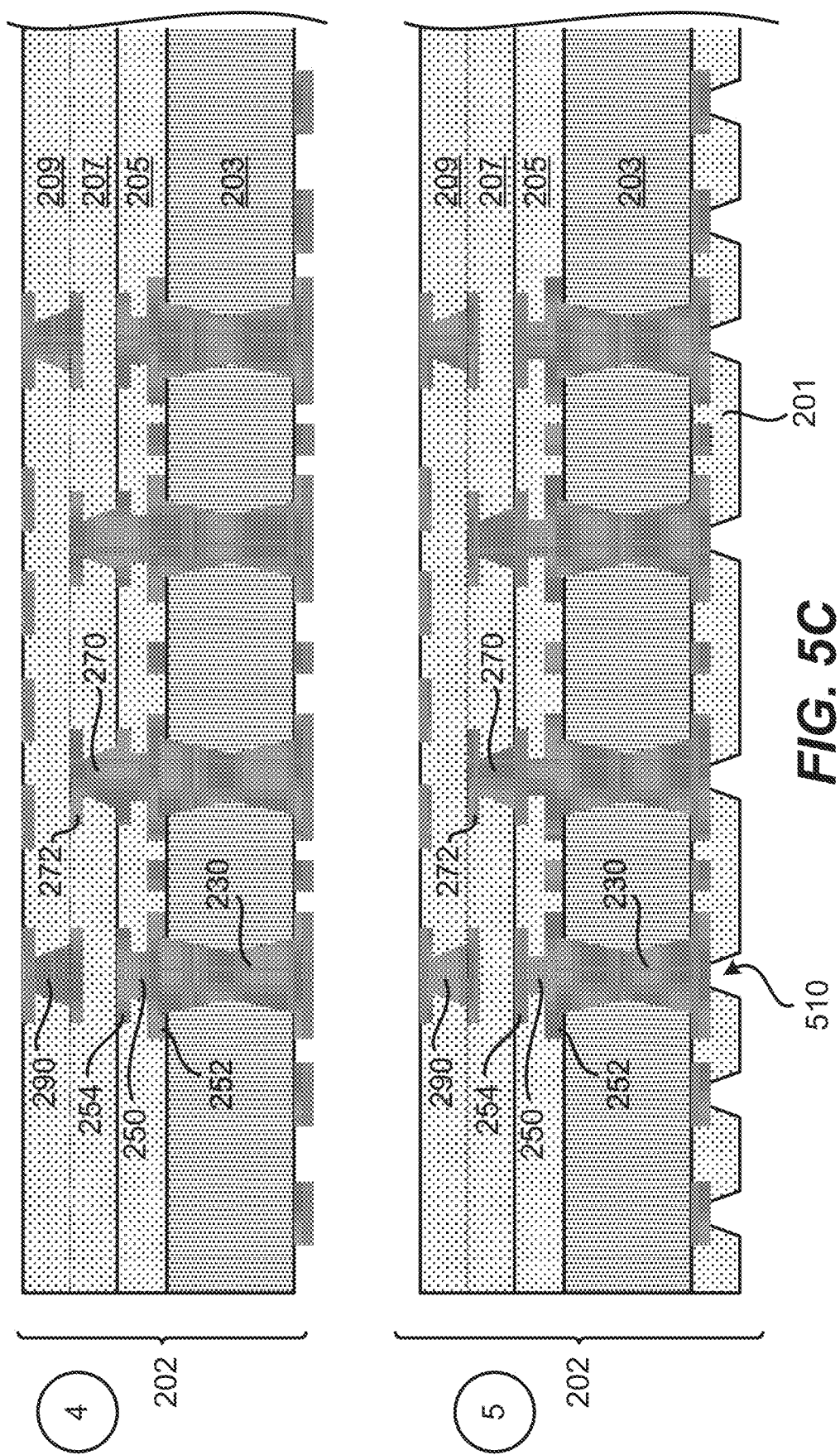

Stage 4, as shown in FIG. 5C, illustrates a state after the plurality of vias 250 are formed in the dielectric layer 205 and the remainder of the pad 252 and the via 230 are formed. A plating process may be used to form the metal layers that define the plurality of vias 250, the pad 252 and the via 230. In some implementations, the via 250, the pad 252 and/or the via 230 may share the same metal (e.g., same metal layer). For example, in some implementations, there may not be a horizontal interface between the via 250, the pad 252 and/or the via 230. An example of a sharing of the same metal (e.g., metal layer) is described in FIG. 7D.

Stage 5 illustrates a state after a dielectric layer 201 is formed over the core layer 203 and portions of the dielectric layer 201 have been selectively removed. For example, a cavity 510 has been formed in the dielectric layer 201.

Figure 5D:
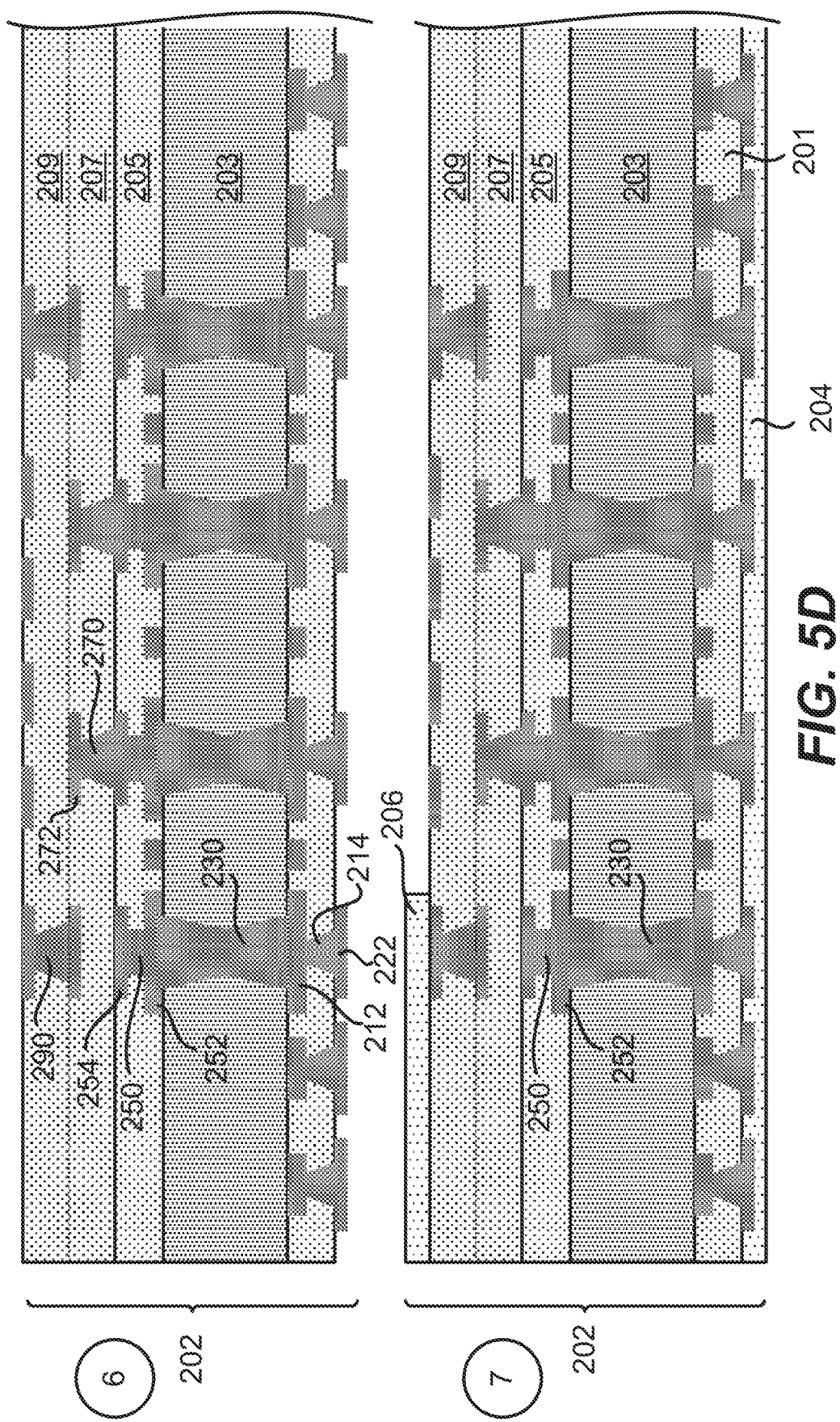

Stage 6, as shown in FIG. 5D, illustrate a state after interconnects are formed in and/or over the dielectric layer 201. In some implementations, a plating process is used to form the interconnects (e.g., pad 212, via 214, pad 222).

Stage 7 illustrates a state after a first solder resist layer 204 and a second solder resist layer 206 are formed over the substrate 202.

FIGS. 5A-5D illustrate a process that allows a substrate that includes different minimum widths and minimum spacings for different portions of the substrate to be fabricated.

Exemplary Device Comprising Embedded Trace Substrate (ETS) with a Core Layer

Figure 6:
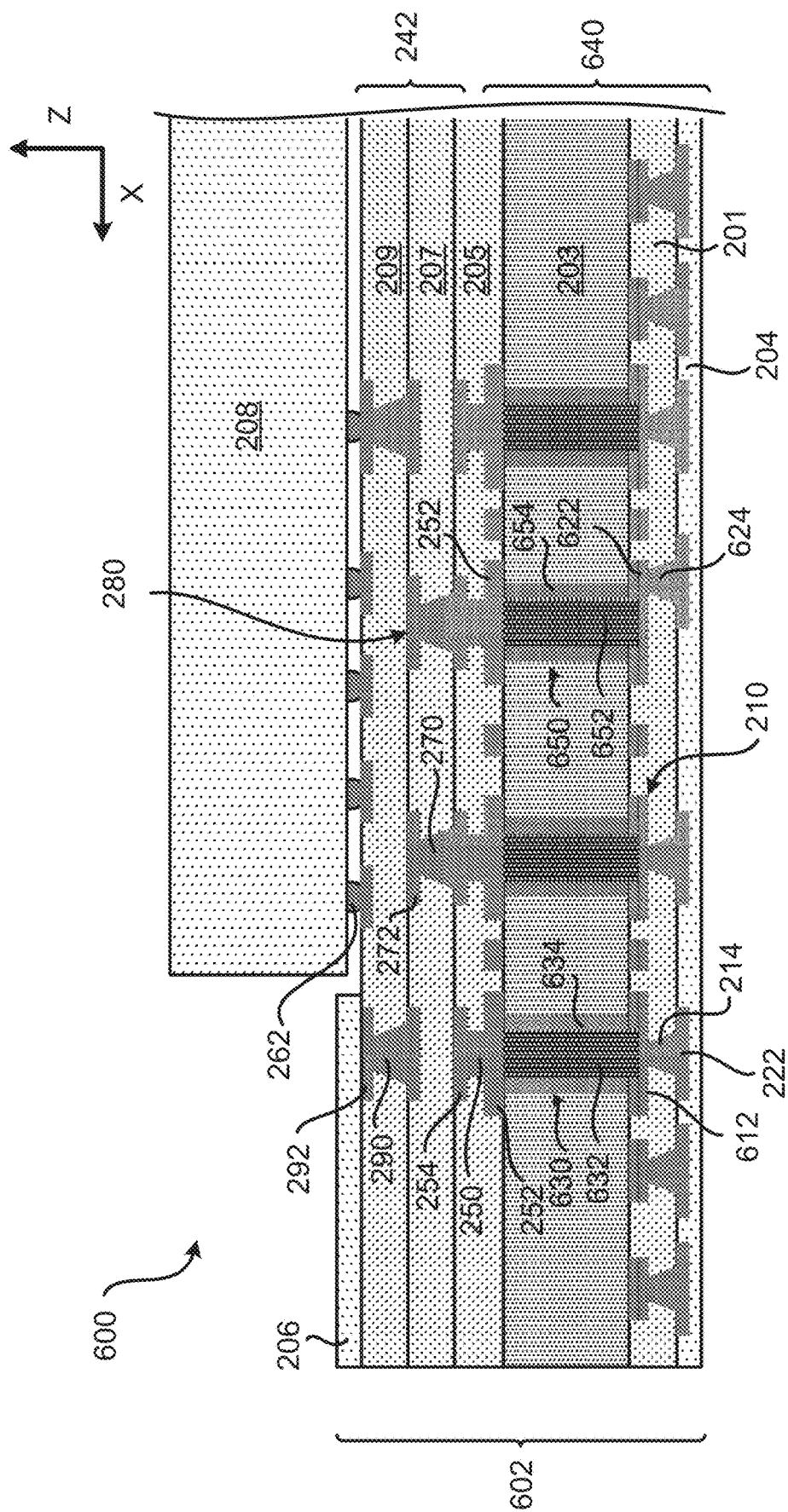
FIG. 6 illustrates a profile view of another package that includes a die and an embedded trace substrate (ETS) with a core layer that includes capped vias.

FIG. 6 illustrates a profile view of another device 600 that includes a substrate 602 and the die 208. The device 600 may be an integrated device that is implemented in a vehicle (e.g., automobile, truck, motorcycle). The device 600 of FIG. 6 is similar to the device 200 of FIG. 2. The device 600 includes a substrate that has capped vias. The device 600 may have similar dimensions, minimum width, minimum spacing, and/or minimum pitch as described for the device 200.

The substrate 602 includes a first substrate portion 640 (e.g., core substrate portion), and a second substrate portion 242 (e.g., coreless substrate portion). The first substrate portion 640 may be a core substrate, and the second substrate portion may be an embedded trace substrate (ETS). The second substrate portion 242 may be a coreless substrate. The first substrate portion 640 is coupled to the second substrate portion 242 through a dielectric layer 205. As described above, the dielectric layer 205 includes two patterned metal layers, a patterned metal layer from the first substrate portion 240 and a patterned metal layer from the second substrate portion 242. The patterned metal layer of the first substrate portion 640 defines a plurality of interconnects for the first substrate portion 640, and the patterned metal layer of the second substrate portion 242 defines a plurality of interconnects for the second substrate portion 242.

The first substrate portion 640 is similar to the first substrate portion 240 of FIG. 2. However, the first substrate portion 640 may include a plurality of vias 630 and a plurality of vias 650 that have different shapes and/or composition than the plurality of vias 230 described in FIG. 2.

FIG. 6 illustrates a core via 630 that travels through the core layer 203. The core via 630 includes a plug material 632 and a metal layer 634. The plug material may be a non-electrically conductive plug material. The plug material may be a composite material. An example of a plug material includes THP-100DX. The plug material 632 is surrounded by the metal layer 634, the pad 612 and the pad 252. For example, the plug material 632 is laterally surrounded by the metal layer 634. Thus, in some implementations, the plug material 632 is not in direct contact with a dielectric material (e.g., core layer 203, dielectric layer 201, dielectric layer 205). As will be further described below in FIG. 7, the pad 612 may be formed by two or more metal layers. Other interconnects on the same metal layer as the pad 612 may also be formed by two or more metal layers. The via is approximately vertically aligned with the center of the core via 630. The core via 630 may have at least one wall that is approximately vertical.

FIG. 6 illustrates a core via 650 that travels through the core layer 203. The core via 650 includes a plug material 652 and a metal layer 654. The metal layer 654 laterally surrounds the plug material 652, and the pad 252 covers a first surface (e.g., top surface) of the plug material 652. A second surface (e.g., bottom surface) of the plug material 652 is covered by the pad 622. The pad 622 may be offset from the center of the core via 650. The pad 622 may include two or more metal layers. In some implementations, the core via 630 and the core via 650 may be referred as capped vias (e.g., capped core vias).

In some implementations, the plug material may not be totally encapsulated by metal layers. Such an example is illustrated and described in FIG. 8 below. Different implementations may use different arrangements of the core via 630 and the core via 650. In some implementations, (i) all the vias in the core layer 203 may be similar to the core via 630, (ii) all the vias in the core layer 203 may be similar to the core via 650, or (iii) the vias in the core layer 203 may have combinations of the core via 630 and the core via 650.

In some implementations, the core via 630 and/or the core via 650 may be used when the core layer 203 has a thickness that is greater than 250 micrometers (μm). At such thicknesses for the core layer 203, it may be more efficient and/or cost effective to fill the cavities of the core vias with a plug material than to fill the cavities with more metal, without sacrificing the performance (e.g., electric conductivity of the via) of the substrate. In some implementations, the overall thickness of the substrate 602 may be in a range of 400-1200 micrometers (μm).

As mentioned above, a dielectric layer 205 (e.g., second dielectric layer) is coupled and located between the first substrate portion 640 (e.g., core substrate) and the second substrate portion 242 (e.g., coreless substrate, embedded trace substrate (ETS)). The dielectric layer 205 is a single dielectric layer. The dielectric layer 205 is coupled to the core layer 203 of the first substrate portion 640, and the dielectric layer 207 of the second substrate portion 242.

The dielectric layer 205 is formed between the first substrate portion 640 and the second substrate portion 242 such that some of core substrate interconnects (e.g., pad 252) from the plurality of core substrate interconnects 210 and some substrate interconnects (e.g., pad 254) from the plurality of substrate interconnects 280 are located in the dielectric layer 205. Thus, as shown in FIG. 6, the dielectric layer 205 includes two patterned metal layers, one patterned metal layer from the first substrate portion 640 and one patterned metal layer from the second substrate portion 242.

The dielectric layer 205 also includes a plurality of vias 250 that are coupled to the plurality of core substrate interconnects 210 and the plurality of substrate interconnects 280.

The first substrate portion 640, the dielectric layer 205 and the second substrate portion 242 may be laminated together to form the substrate 602. The process allows a first plurality of bump interconnects to have a pitch in a range of 0.35-0.4 millimeters (mm), and a second plurality of bump interconnects to have a pitch in a range of 0.7-0.8 millimeters (mm).

Having described a substrate that includes different minimum width, spacing and pitch interconnects designs for different portions of the substrate, methods for fabricating the disclosed substrate will now be described below.

Exemplary Sequence for Fabricating an Embedded Trace Substrate (ETS) with a Core Layer In some implementations, fabricating a substrate includes several processes. FIG. 7 (which includes FIGS. 7A-7F) illustrates an exemplary sequence for providing or fabricating a substrate. In some implementations, the sequence of FIGS. 7A-7F may be used to provide or fabricate the substrate 602 of FIG. 6, other substrates, and/or other devices described in the present disclosure. The sequence of FIGS. 7A-7F is similar to the sequence of FIGS. 5A-5D. In some implementations, the sequence of FIGS. 7A-7F may be used when the core layer is 400 micrometers (μm) or greater.

It should be noted that the sequence of FIGS. 7A-7F may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Figure 7A:
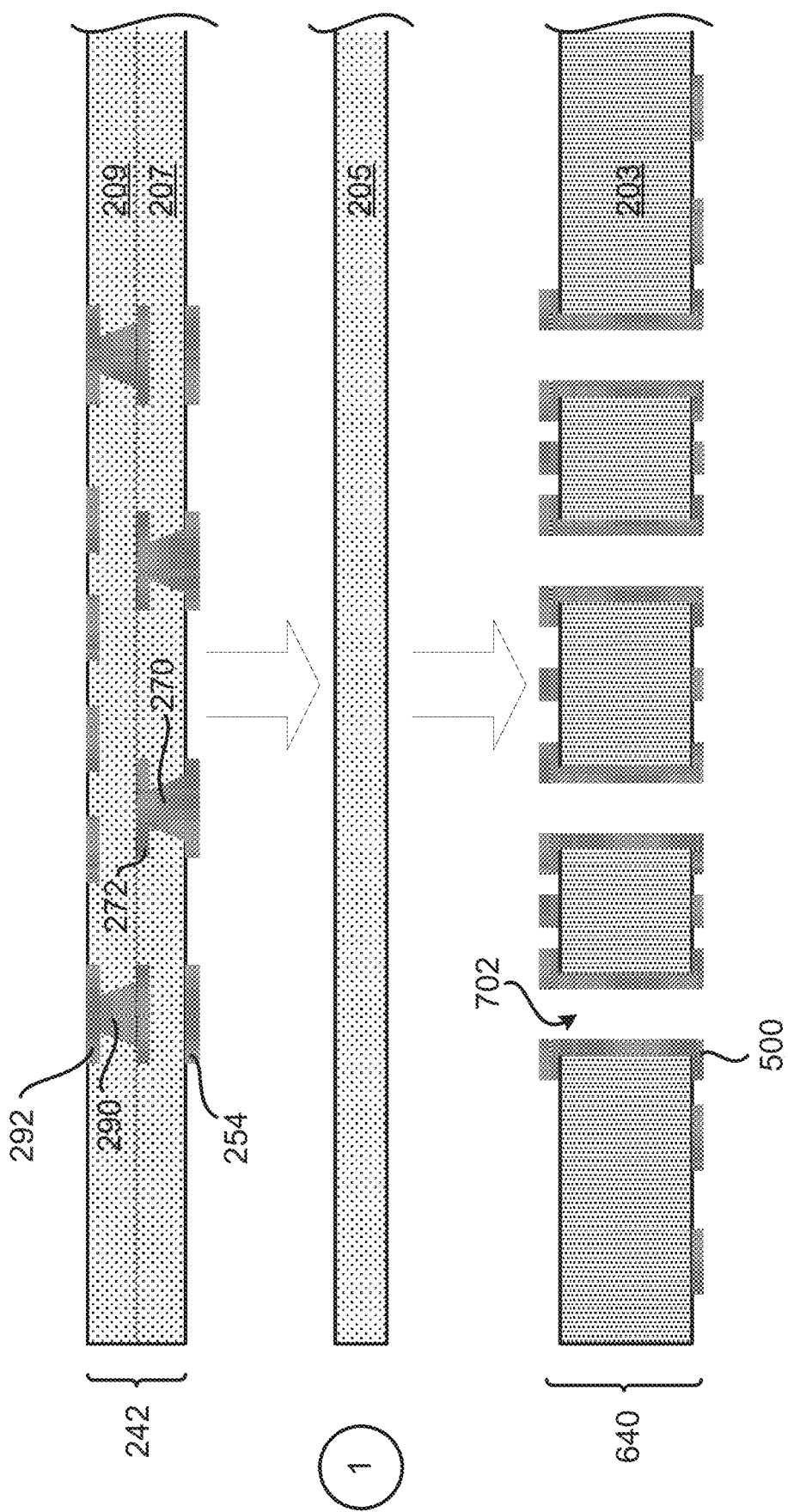
FIG. 7 (comprising FIGS. 7A-7F) illustrates an exemplary sequence for fabricating a substrate that includes an embedded trace substrate (ETS) with a core layer that includes capped vias.

Stage 1, as shown in FIG. 7A, illustrates a second substrate portion 242 being coupled to a first substrate portion 640 such that a dielectric layer 205 is between the first substrate portion 640 and the second substrate portion 242. A lamination process may be used to couple the first substrate portion 640, the dielectric layer 205 and the second substrate portion 242. In some implementations, the first substrate portion 640 includes a core layer 203 and a plurality of cavities 702 that travel through the core layer 203. The plurality of cavities 702 have side walls that are approximately vertical. The first substrate portion 640 includes at least one patterned metal layer 500 over the surfaces of the first substrate portion 640. The at least one patterned metal layer 500 may define interconnects (e.g., core substrate interconnects, core vias) for the first substrate portion 640, as described in FIG. 6. For example, the at least one patterned metal layer 500 may define the pad 252, the via 230, the pad 612, and the pad 622. The at least one patterned metal layer 500 may include a seed layer. The core layer 203 may include different dielectric materials, such a silicon, glass, quartz, epoxy, or combinations thereof. The core layer 203 of the first substrate portion 640 may have a thickness in a range of 400-1200 micrometers (μm). The dielectric layer 205 may include dry film, such as Ajinomoto dry film (ABF) and/or prepreg. The dielectric layer 207 and/or the dielectric layer 209 may include polyimide.

Figure 7B:
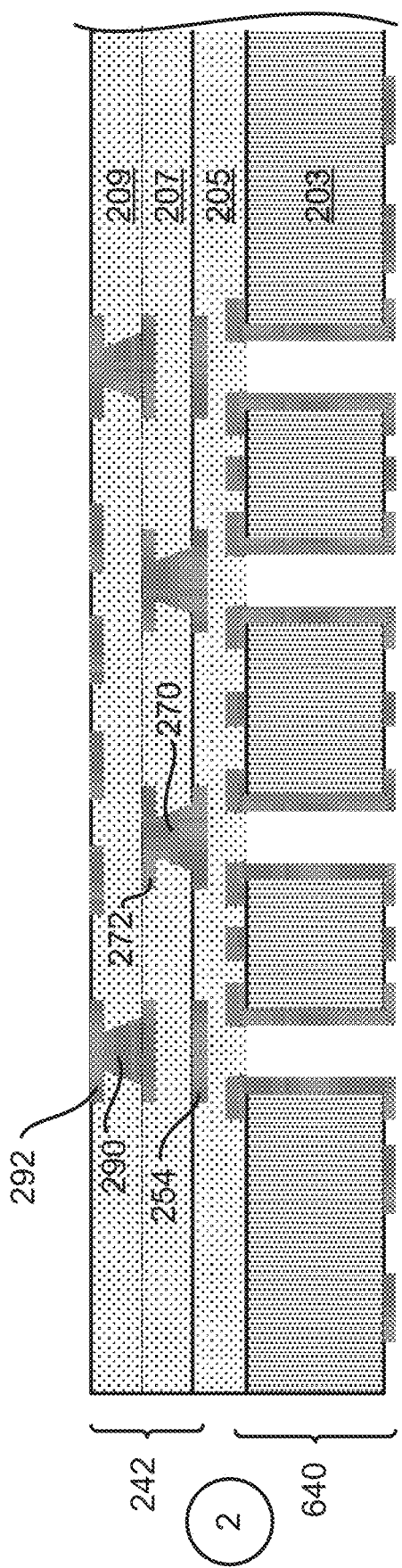
Figure 7B:
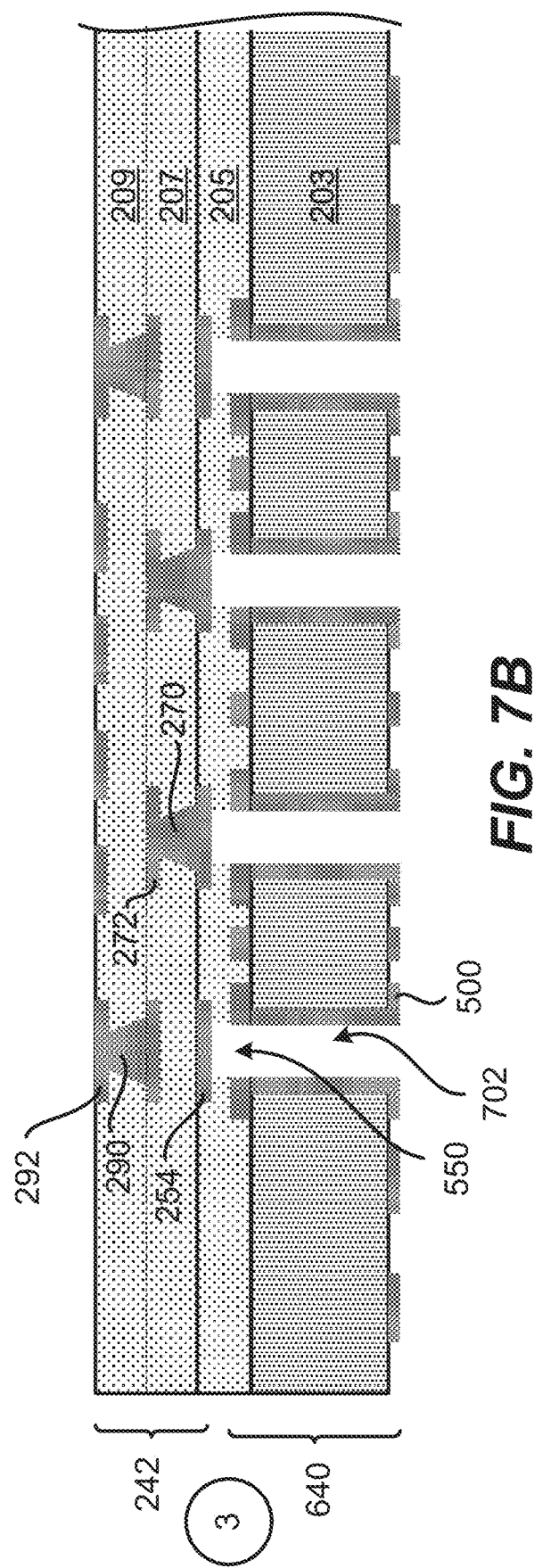

Stage 2, as shown in FIG. 7B, illustrates a state after the second substrate portion 242 has been coupled to the first substrate portion 640 through the dielectric layer 205. The dielectric layer 205 encapsulates the interconnects (e.g., pad 252) from the first substrate portion 640 and the interconnects (e.g., pad 254) from the second substrate portion 242.

Stage 3 illustrates a state after cavities 550 are formed in the dielectric layer 205. Different implementations may use different processes for forming the cavities. In some implementations, a laser etching process is used to form the cavities. In some implementations, a photolithography process may be used to form the cavities.

Figure 7C:
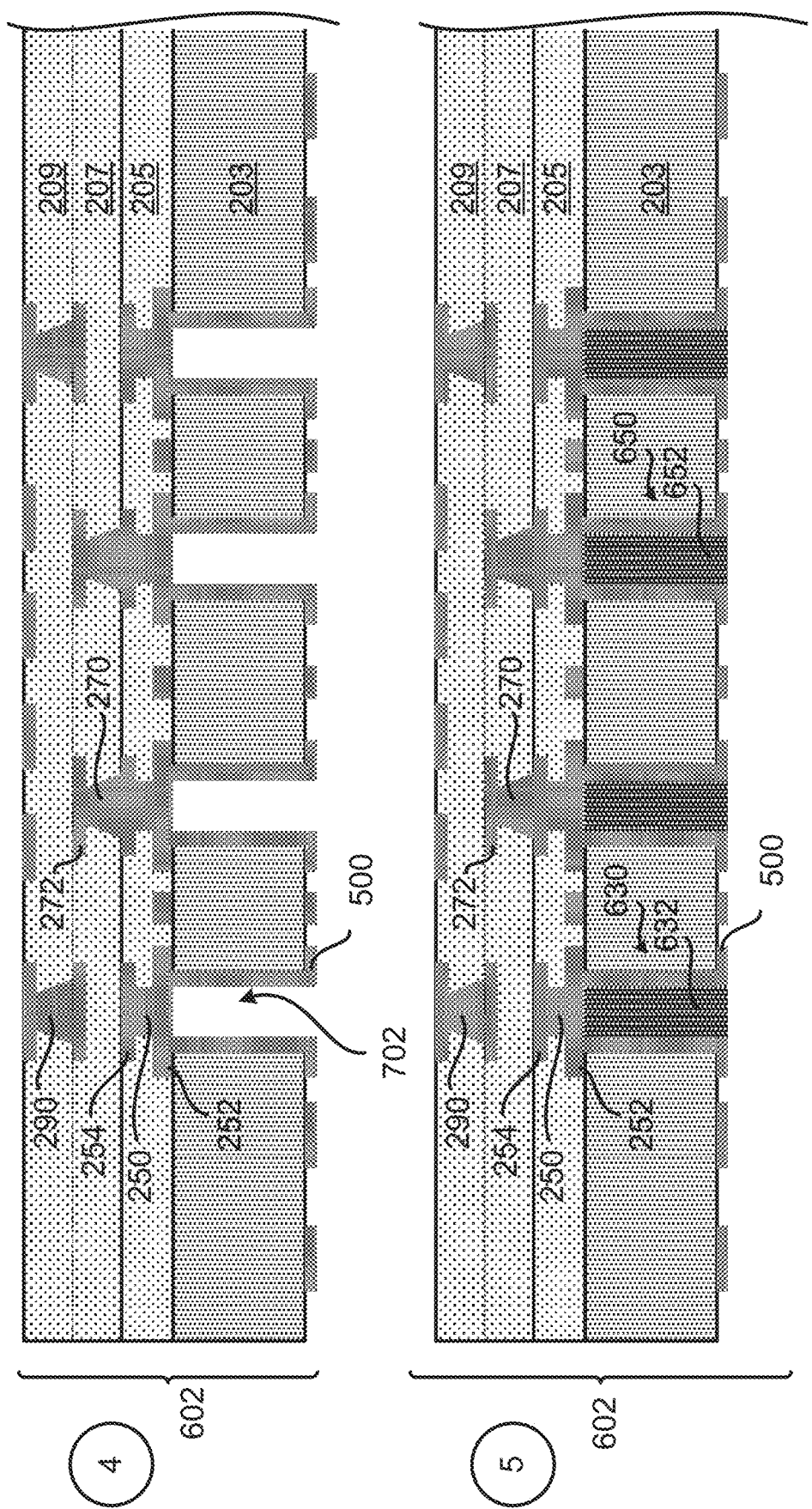

Stage 4, as shown in FIG. 7C, illustrates a state after the plurality of vias 250 are formed in the dielectric layer 205. A plating process may be used to form the metal layers that define the plurality of vias 250. The plating process may also form the pad 252. In some implementations, the pad 252 and the via 250 may share the same metal (e.g., same metal layer).

Stage 5 illustrates a state after the cavities 702 are filled with a plug material (e.g., 632, 652). Different implementations may fill the cavities 702 with the plug material differently. The plug material may be a non-electrically conductive plug material. The plug material may be a composite material.

Figure 7D:
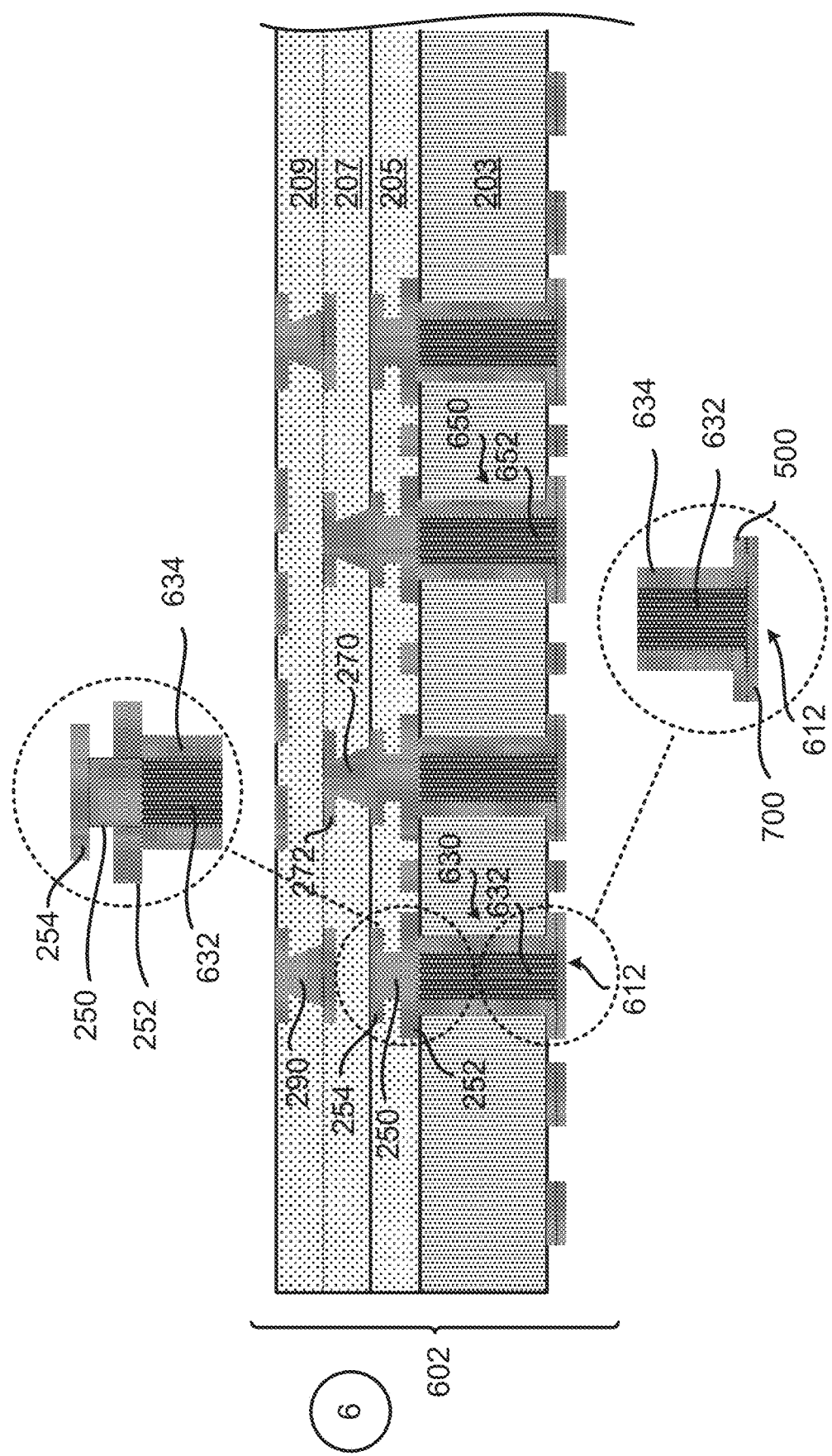

Stage 6, as shown in FIG. 7D, illustrates a state after a metal layer is formed to cover some or all of the plug material. For example, the plug material 632 is covered by the pad 612. More specifically, the plug material 632 is covered by the metal layer 700 of the pad 612. The result, is a core via 630 with a plug material 632 that is surrounded by metal. As shown in the close-up view, the pad 612 includes two metal layers, the metal layer 500 and the metal layer 700. In some implementations, a buffing process may be applied on the metal layer(s) that is formed.

It is noted that in the process of fabricating the via 230, the via 230 may share metal with the pad 252, as illustrated in the close-up view of the pad 254, the via 250 and the pad 252. In some implementations, there may not be a horizontal interface between the via 250 and the pad 252.

Figure 7E:
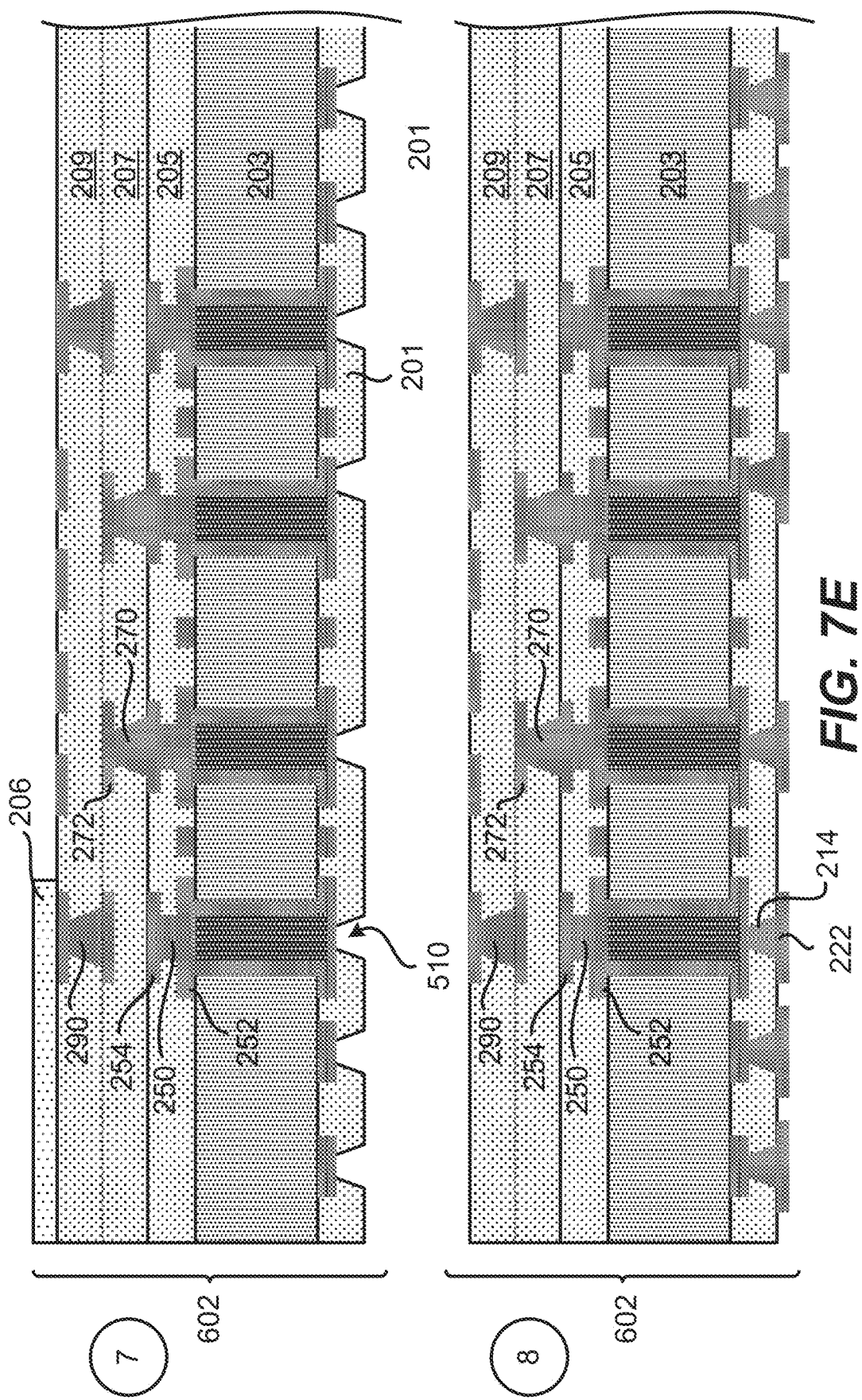

Stage 7, as shown in FIG. 7E, illustrates a state after a dielectric layer 201 is formed over the core layer 203 and portions of the dielectric layer 201 have been selectively removed. For example, a cavity 510 has been formed in the dielectric layer 201.

Stage 8 illustrate a state after interconnects are formed in the dielectric layer 201. In some implementations, a plating process is used to form the interconnects (e.g., via 214, pad 222).

Figure 7F:
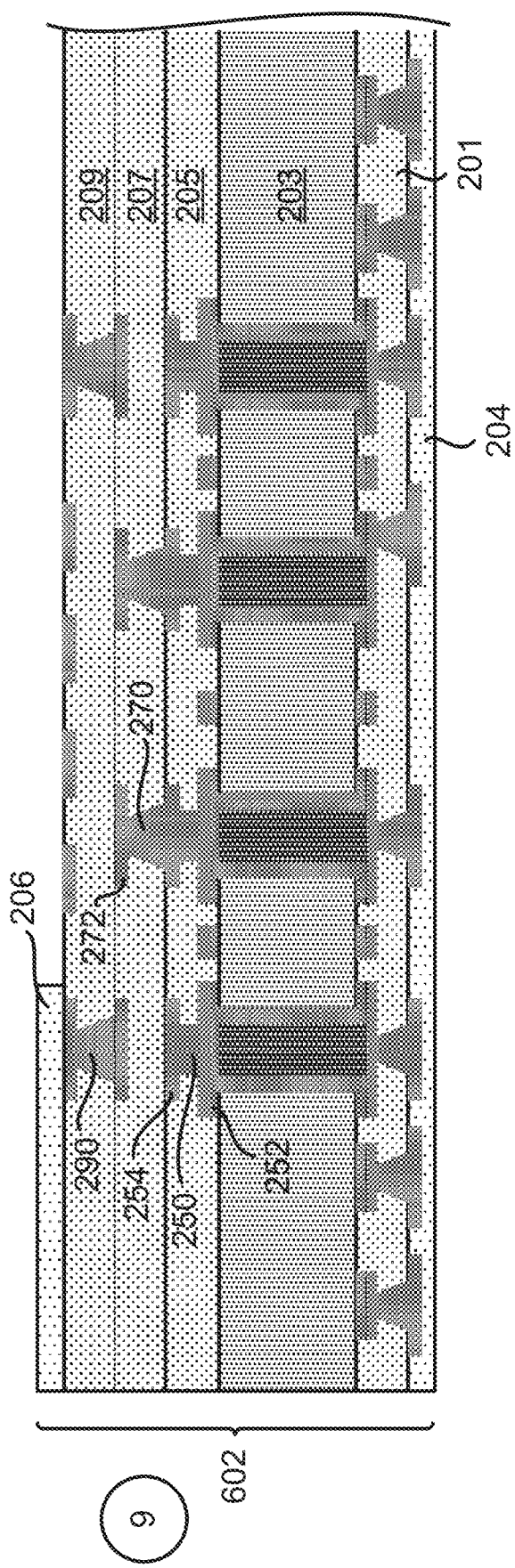

Stage 9, as shown in FIG. 7F, illustrates a state after a first solder resist layer 204 and a second solder resist layer 206 are formed over the substrate 602.

FIGS. 7A-7F illustrate a process that allows a substrate that includes different minimum widths and minimum spacings for different portions of the substrate to be fabricated.

Exemplary Device Comprising Embedded Trace Substrate (ETS) with a Core Layer

Figure 8:
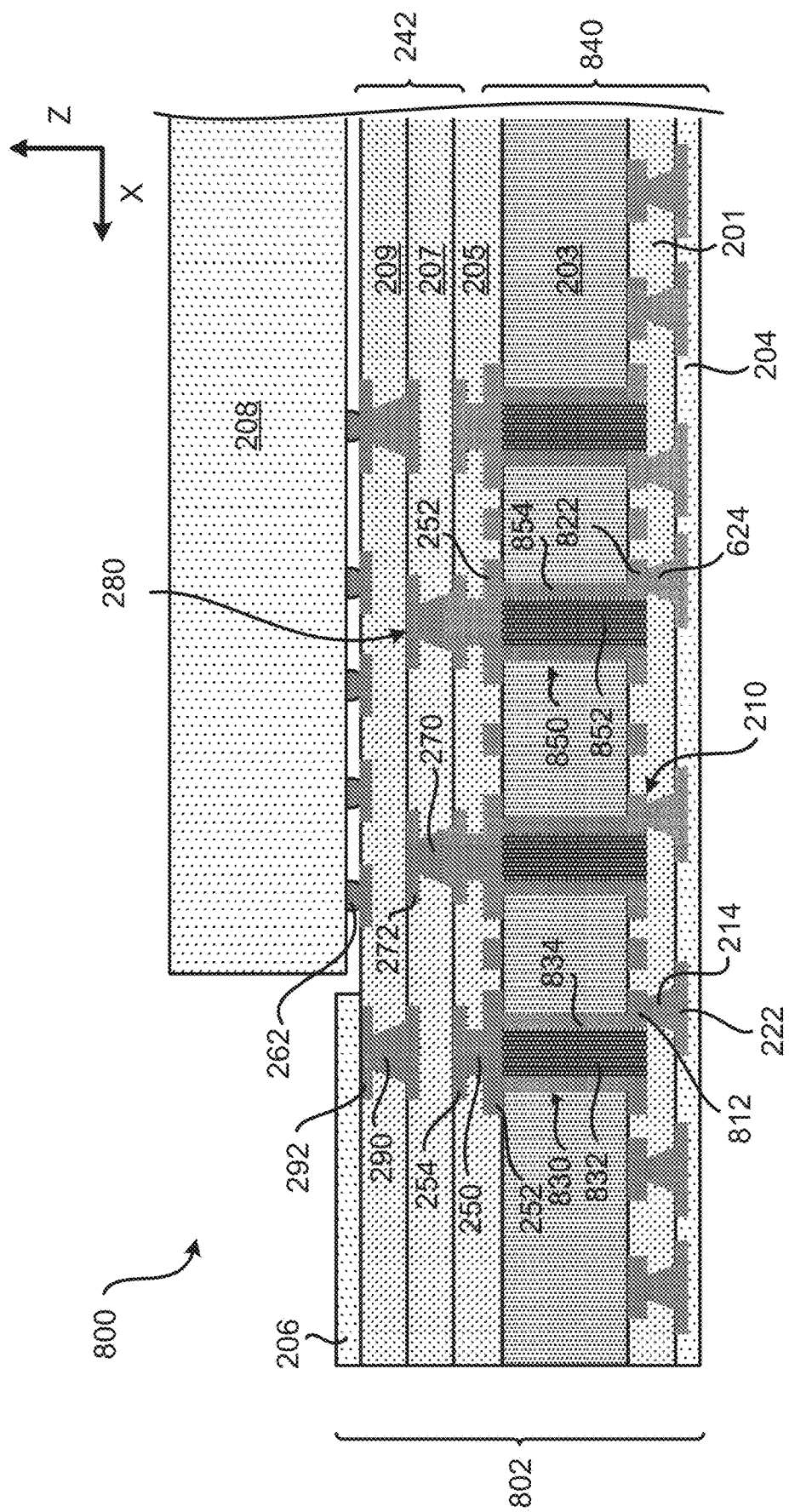
FIG. 8 illustrates a profile view of another package that includes a die and an embedded trace substrate (ETS) with a core layer that includes uncapped vias.

FIG. 8 illustrates a profile view of another device 800 that includes a substrate 802 and a die 208. The device 800 may be an integrated device that is implemented in a vehicle (e.g., automobile, truck, motorcycle). The device 800 of FIG. 8 is similar to the device 600 of FIG. 6. The device 800 may have similar dimensions, minimum width, minimum spacing, and/or minimum pitch as described in the device 600 and/or the device 200. As will be described below, one difference between the device 800 and the device 600 is that the device 800 includes uncapped vias in the core layer.

The substrate 802 includes a first substrate portion 840 (e.g., core substrate portion), and a second substrate portion 242 (e.g., coreless substrate portion). The first substrate portion 840 may be a core substrate, and the second substrate portion may be an embedded trace substrate (ETS). The second substrate portion 242 may be a coreless substrate. The first substrate portion 840 is coupled to the second substrate portion 242 through a dielectric layer 205. As described above, the dielectric layer 205 includes two patterned metal layers, a patterned metal layer from the first substrate portion 840 and a patterned metal layer from the second substrate portion 242. The patterned metal layer of the first substrate portion 840 defines a plurality of interconnects for the first substrate portion 840, and the patterned metal layer of the second substrate portion 242 defines a plurality of interconnects for the second substrate portion 242.

The first substrate portion 840 is similar to the first substrate portion 640 of FIG. 6. The first substrate portion 840 may include a plurality of vias 830 and/or 850 that have different shapes, configuration and/or composition than the plurality of vias 630 and/or 650 described in FIG. 6.

FIG. 8 illustrates a core via 830 that travels through the core layer 203. The core via 830 includes a plug material 832 and a metal layer 834. The plug material may be a non-electrically conductive plug material. The plug material may be a composite material. The metal layer 834 laterally surrounds the plug material 832, and the pad 252 covers the first surface (e.g., top surface) of the plug material 832. However, the second surface (e.g., bottom surface) of the plug material 832 is not covered by a metal layer. Instead, the second surface of the plug material 832 is covered by the dielectric layer 201. In some implementations, the core via 830 may be referred as an uncapped via (e.g., uncapped core via). The pad 812 is coupled to the core via 830 in an offset manner, and the via 214 is coupled to the pad 812. The core via 830 may have at least one wall that is approximately vertical. FIG. 8 also illustrates a core via 850, which may be similar to the core via 830.

Different implementations may use different arrangements of the core via 830, the core via 630, the core via 650, and/or the core via 850. In some implementations, (i) all the vias in the core layer 203 may be similar to the core via 830, (ii) all the vias in the core layer 203 may be similar to the core via 630 and/or the core via 650, or (iii) the vias in the core layer 203 may have combinations of the core via 830, the core via 630 and/or the core via 650.

In some implementations, the core via 830 may be used when the core layer 203 has a thickness that is greater than 250 micrometers (μm). At such thicknesses for the core layer 203, it may be more efficient and/or cost effective to fill the cavities of the core vias with a plug material than to fill the cavities with more metal, without sacrificing the performance (e.g., electric conductivity of the via) of the substrate. In some implementations, the overall thickness of the substrate 802 may be in a range of 400-1200 micrometers (μm).

The first substrate portion 840, the dielectric layer 205 and the second substrate portion 242 may be laminated together to form the substrate 802. The process allows a first plurality of bump interconnects to have a pitch in a range of 0.35-0.4 millimeters (mm), and a second plurality of bump interconnects to have a pitch in a range of 0.7-0.8 millimeters (mm).

Having described a substrate that includes different minimum width, spacing and pitch interconnects designs for different portions of the substrate, methods for fabricating the disclosed substrate will now be described below.

Exemplary Sequence for Fabricating an Embedded Trace Substrate (ETS) with a Core Layer FIG. 9 (which includes FIGS. 9A-9E) illustrates an exemplary sequence for providing or fabricating a substrate. In some implementations, the sequence of FIGS. 9A-9E may be used to provide or fabricate the substrate 802 of FIG. 8, other substrates, and/or other devices described in the present disclosure. The sequence of FIGS. 9A-9E is similar to the sequence of FIGS. 7A-7F. In some implementations, the sequence of FIGS. 9A-9E may be used when the core layer is 400 micrometers (μm) or greater.

It should be noted that the sequence of FIGS. 9A-9E may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. It is noted that stages 1-5 of FIGS. 9A-9D may be similar to stages 1-5 of FIGS. 7A-7C.

Figure 9A:
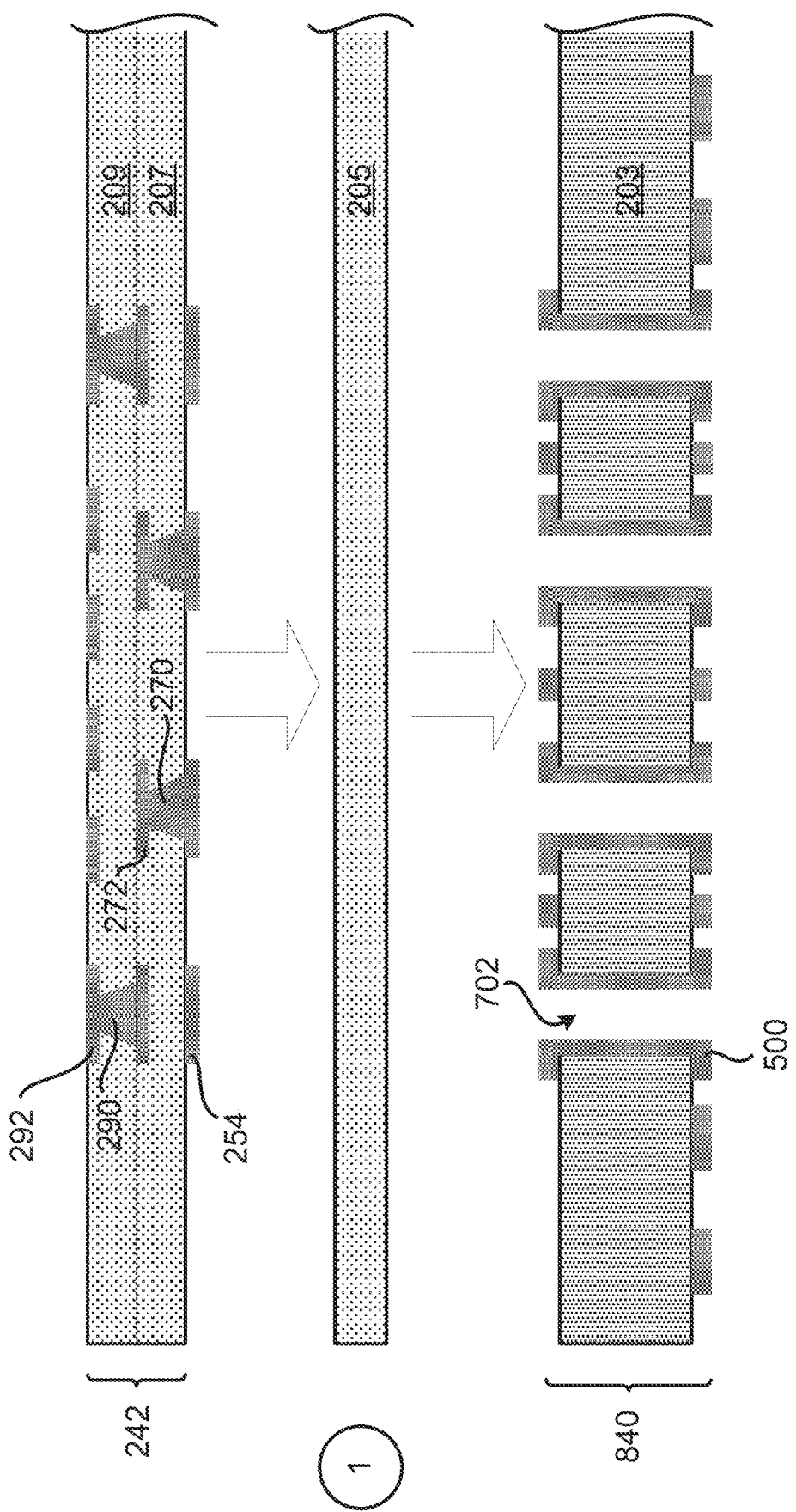
FIG. 9 (comprising FIGS. 9A-9E) illustrates an exemplary sequence for fabricating a substrate that includes an embedded trace substrate (ETS) with a core layer that includes uncapped vias.

Stage 1, as shown in FIG. 9A, illustrates a second substrate portion 242 being coupled to a first substrate portion 840 such that a dielectric layer 205 is between the first substrate portion 240 and the second substrate portion 242. The first substrate portion 840, the dielectric layer 205 and the second substrate portion 242 may be laminated together to form the substrate 802. In some implementations, the first substrate portion 840 includes a core layer 203 and a plurality of cavities 702 that travel through the core layer 203. The plurality of cavities 702 have side walls that are approximately vertical. The first substrate portion 840 includes at least one patterned metal layer 500 over the surfaces of the first substrate portion 840. The at least one patterned metal layer 500 may define interconnects (e.g., core substrate interconnects) for the first substrate portion 840, as described in FIG. 8. For example, the at least one patterned metal layer 500 may define the pad 252, via 230 and the pad 812. The at least one patterned metal layer 500 may include a seed layer. The core layer 203 may include different dielectric materials, such a silicon, glass, quartz, epoxy, or combinations thereof. The core layer 203 of the first substrate portion 840 may have a thickness in a range of 400-1200 micrometers (μm). The dielectric layer 205 may include dry film, such as Ajinomoto dry film (ABF) and/or prepreg. The dielectric layer 207 and/or the dielectric layer 209 may include polyimide.

Figure 9B:
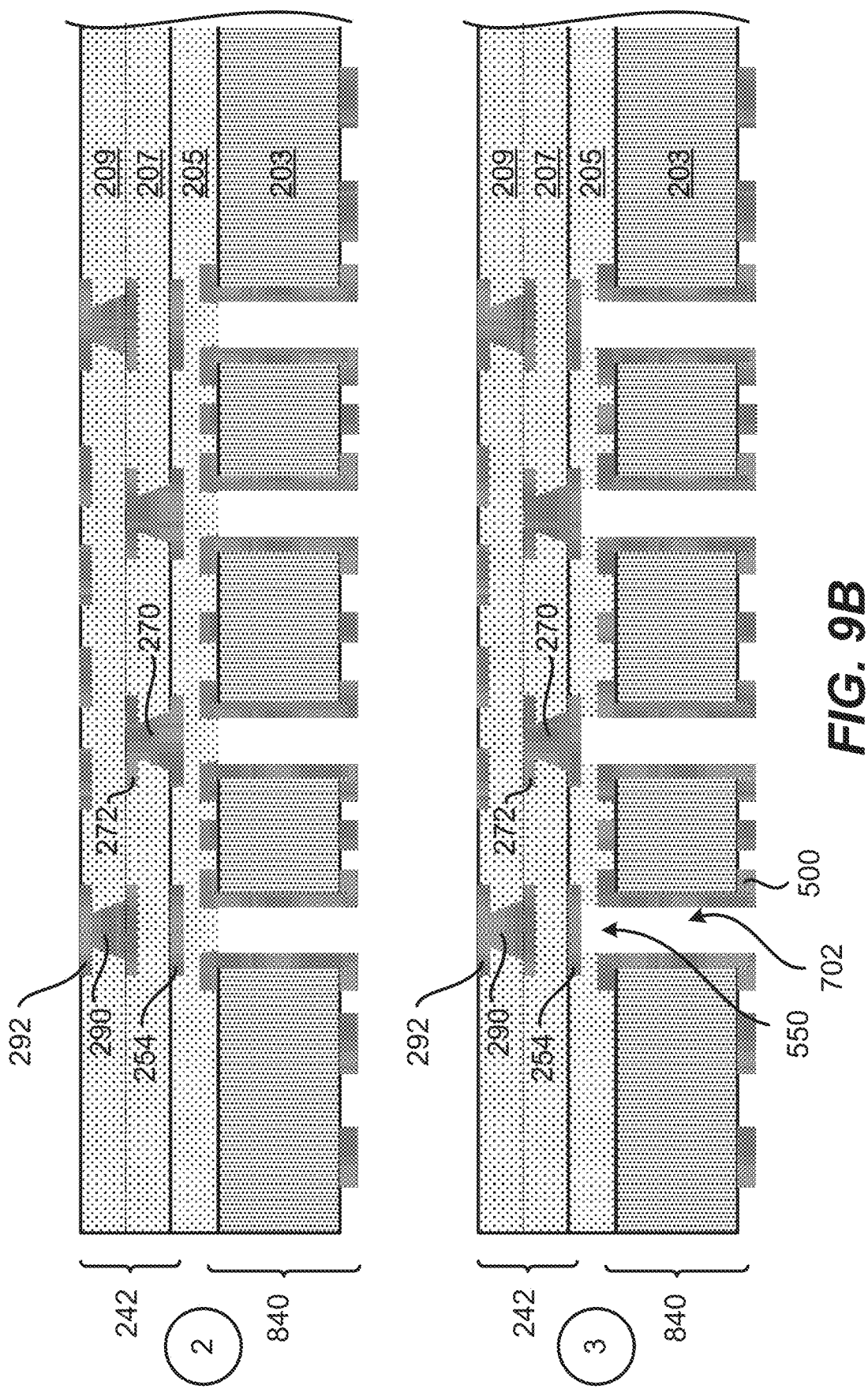

Stage 2, as shown in FIG. 9B, illustrates a state after the second substrate portion 242 has been coupled to the first substrate portion 840 through the dielectric layer 205. The dielectric layer 205 encapsulates the interconnects (e.g., pad 252) from the first substrate portion 840 and the interconnects (e.g., pad 254) from the second substrate portion 242.

Stage 3 illustrates a state after cavities 550 are formed in the dielectric layer 205. Different implementations may use different processes for forming the cavities. In some implementations, a laser etching process is used to form the cavities. In some implementations, a photolithography process may be used to form the cavities.

Figure 9C:
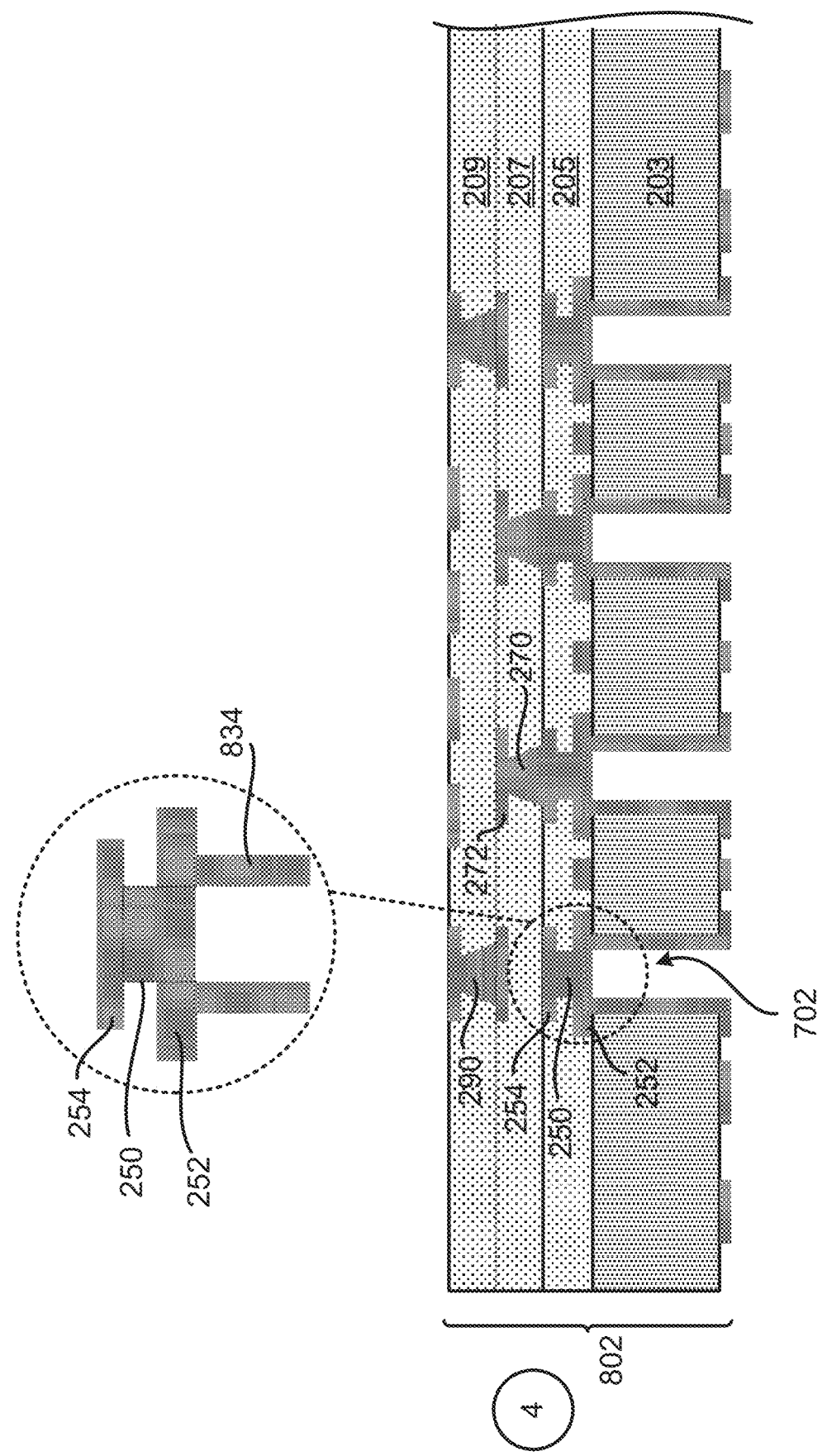

Stage 4, as shown in FIG. 9C, illustrates a state after the plurality of vias 250 are formed in the dielectric layer 205. A plating process may be used to form the metal layers that define the plurality of vias 250. It is noted that in the process of fabricating the vias 250, the via 250 may share metal with the pad 252, as illustrated in the close-up view of the pad 254, the via 250 and the pad 252. In some implementations, there may not be a horizontal interface between the via 250 and the pad 252.

Figure 9D:
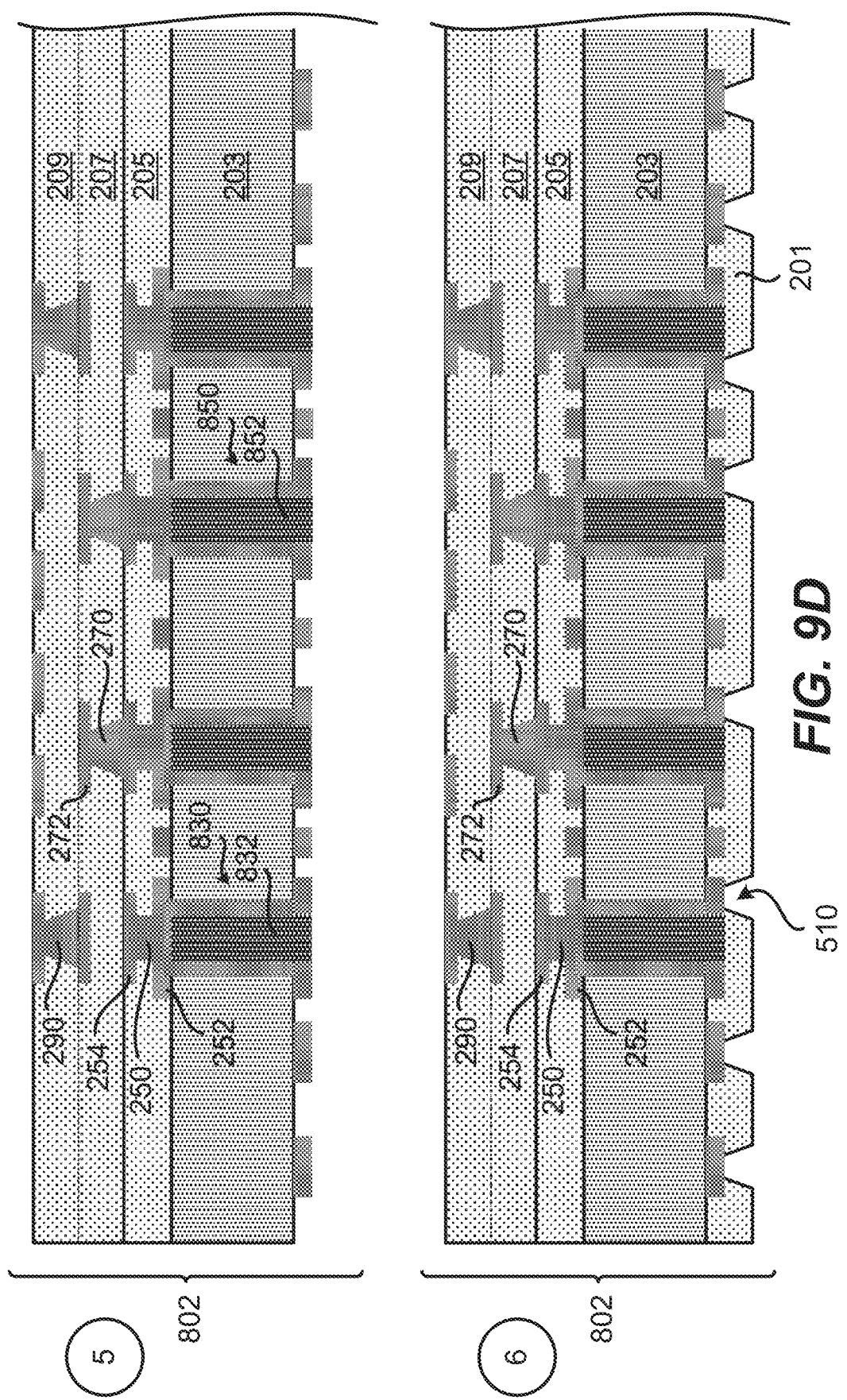

Stage 5, as shown in FIG. 9D, illustrates a state after the cavities 702 are filled with a plug material (e.g., 832, 852). Different implementations may fill the cavities 702 with the plug material differently. The plug material may be a non-electrically conductive plug material. The plug material may be a composite material.

Stage 6 illustrates a state after a dielectric layer 201 is formed over the core layer 203 and portions of the dielectric layer 201 have been selectively removed. For example, a cavity 510 has been formed in the dielectric layer 201.

Figure 9E:
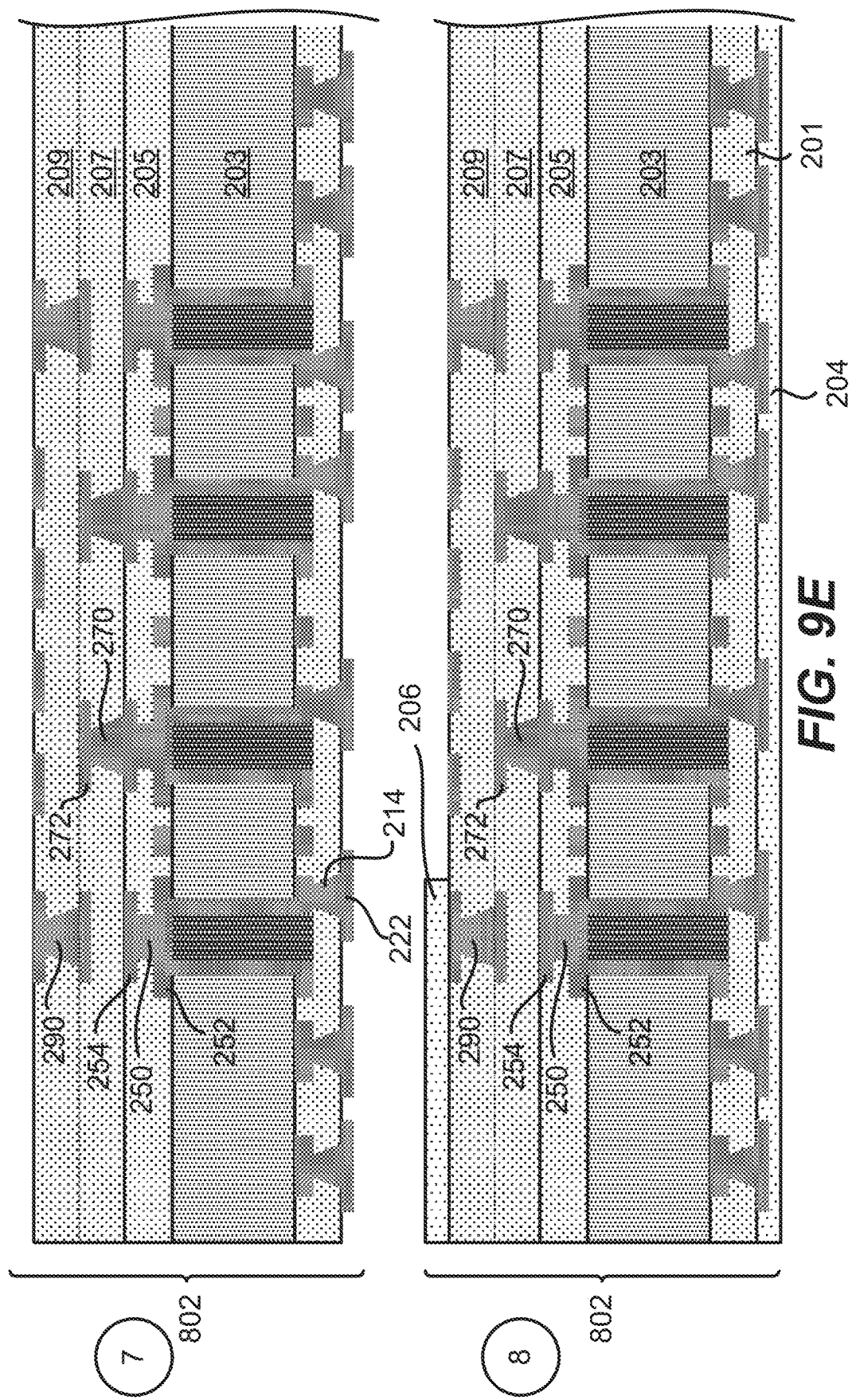

Stage 7, as shown in FIG. 9E, illustrates a state after interconnects are formed in the dielectric layer 201. In some implementations, a plating process is used to form the interconnects (e.g., via 214, pad 222).

Stage 8 illustrates a state after a first solder resist layer 204 and a second solder resist layer 206 are formed over the substrate 802.

FIGS. 9A-9E illustrate a process that allows a substrate that includes different minimum widths and minimum spacings for different portions of the substrate to be fabricated.

Figure 10:
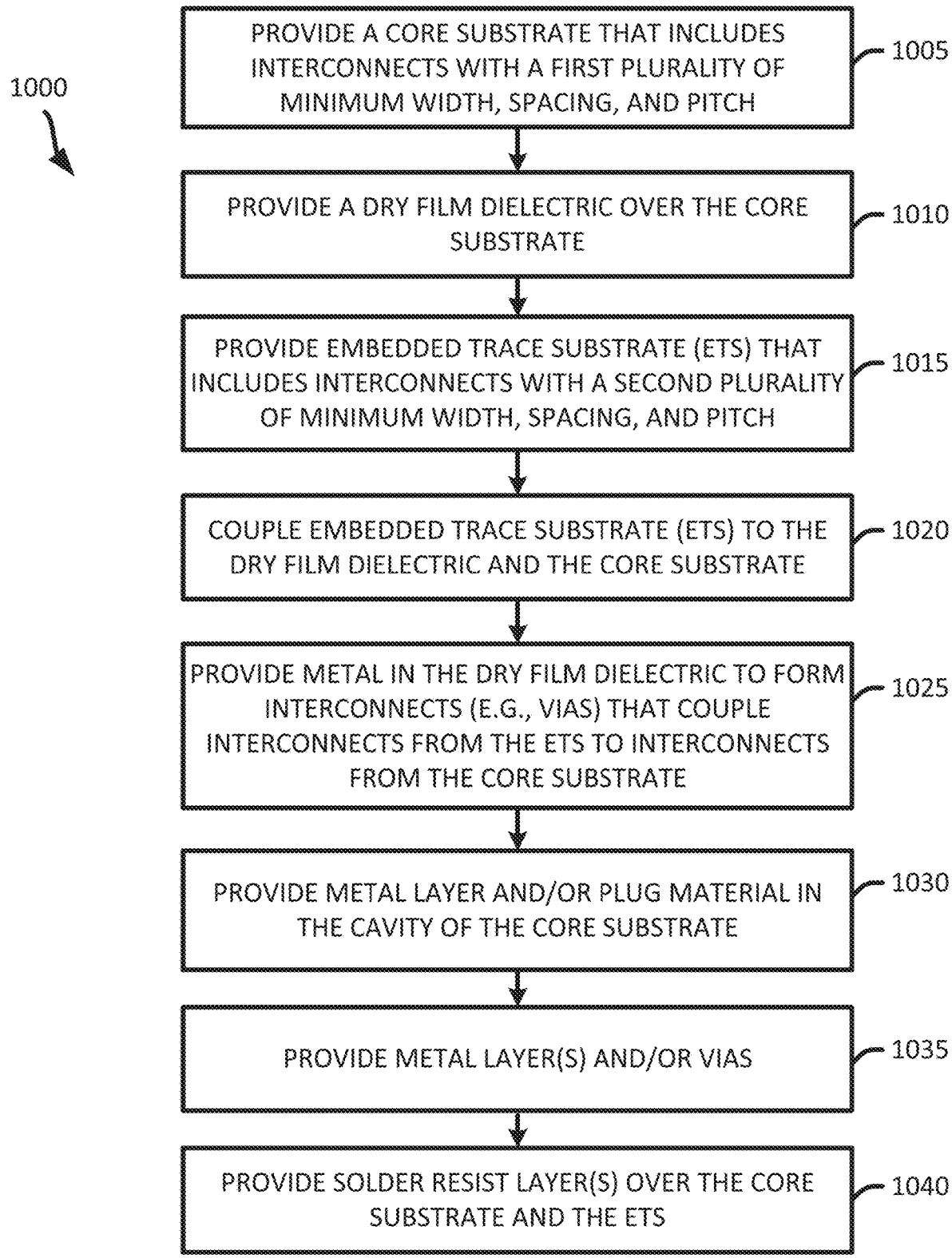
FIG. 10 illustrates an exemplary flow diagram of a method for fabricating a substrate that includes an embedded trace substrate (ETS) with a core layer.

Exemplary Flow Diagram of a Method for Fabricating an Embedded Trace Substrate (ETS) with a Core Layer In some implementations, fabricating a substrate includes several processes. FIG. 10 illustrates an exemplary flow diagram of a method 1000 for providing or fabricating a substrate. In some implementations, the method 1000 of FIG. 10 may be used to provide or fabricate the substrate of FIG. 2, FIG. 6 and/or FIG. 8 described in the present disclosure. For example, the method of FIG. 10 may be used to fabricate the substrates 202, 602 and/or 802.

It should be noted that the sequence of FIG. 10 may combine one or more processes in order to simplify and/or clarify the method for providing or fabricating a substrate. In some implementations, the order of the processes may be changed or modified.

The method 1000 provides (at 1005) a core substrate that includes interconnects with a first plurality of minimum width, minimum spacing, and minimum pitch. In some implementations, the core substrate may be the first substrate portion (e.g., 240, 640, 840), as described in FIGS. 2, 6, and 8. Examples of fabricating and/or providing the core substrate are described in FIGS. 11A-11B and 12. In some implementations, the core substrate includes a core layer 203 and a plurality of cavities (e.g., 502, 702) that travel through the core layer 203. The core substrate includes at least one patterned metal layer 500 over the surfaces of the core substrate.

The method 1000 provides (at 1010) a dry film dielectric layer over the core substrate. The dry film dielectric layer may include dry film, such as Ajinomoto dry film (ABF) and/or prepreg. In some implementations the dry film dielectric layer may be the dielectric layer 205.

The method 1000 provides (at 1015) an embedded trace substrate (ETS) that includes interconnects with a second plurality of minimum width, minimum spacing and minimum pitch. In some implementations, the ETS is a coreless substrate. In some implementations, the ETS is the second substrate portion 242, as described in FIGS. 2, 6, and 8. An example of fabricating and/or providing the ETS is described in FIG. 14A-14B. The ETS may include one or more several dielectric layers (e.g., 207, 209). The dielectric layer may include polyimide.

The method 1000 couples (at 1020) the ETS to the dry film dielectric layer and the core substrate. In some implementations, a lamination process is used to couple the ETS to the dry film dielectric layer and the core substrate. Examples of coupling the ETS to the dry film dielectric layer and the core substrate are described and illustrated in FIGS. 5A-5B, 7A-7B and 9A-9B.

The method 1000 provides (at 1025) metal in the dry film dielectric layer to form interconnects (e.g., vias) that couple interconnects from the ETS to interconnects from the core substrate. In some implementations, cavities may be formed in the dry film dielectric layer (e.g., photoetching, laser process) so that metal may be formed in the cavities of the dry film dielectric layer. The metal may be formed using a plating process. The forming of the metals may form a via and a pad that share the same metal. Examples of forming the cavities and providing the plating in the cavities are illustrated and described in stages 3 and 4 of FIGS. 7B-7C.

The method 1000 provides (at 1030) metal and/or a plug material (e.g., 632) in the cavities of the core substrate (e.g., cavity of the core layer 203). In some implementations, whether a metal or a plug material is provided in the cavities of the core layer may depend on the thickness of the core layer 203. The plug material may be a non-electrically conductive plug material. The plug material may be a composite material. A plating process may be used to provide the metal in the cavities of the core layer 203. Examples of providing the metal and/or the plug material are described in stages 4-6 of FIGS. 5C-5D, and stages 5-8 of FIGS. 7C-7F. The method may provide additional metal layers and/or dielectric layers over the core layer.

The method may provide (at 1035) interconnects (e.g., metal layer, pad, vias) and/or dielectric layer(s) over the core layer. A plating process may be used to form the interconnects.

The method 1000 provides (at 1040) solder resist layer(s) (e.g., 204, 206) over the core layer and the ETS.

Exemplary Sequence for Fabricating a Core Substrate

Figure 11A:
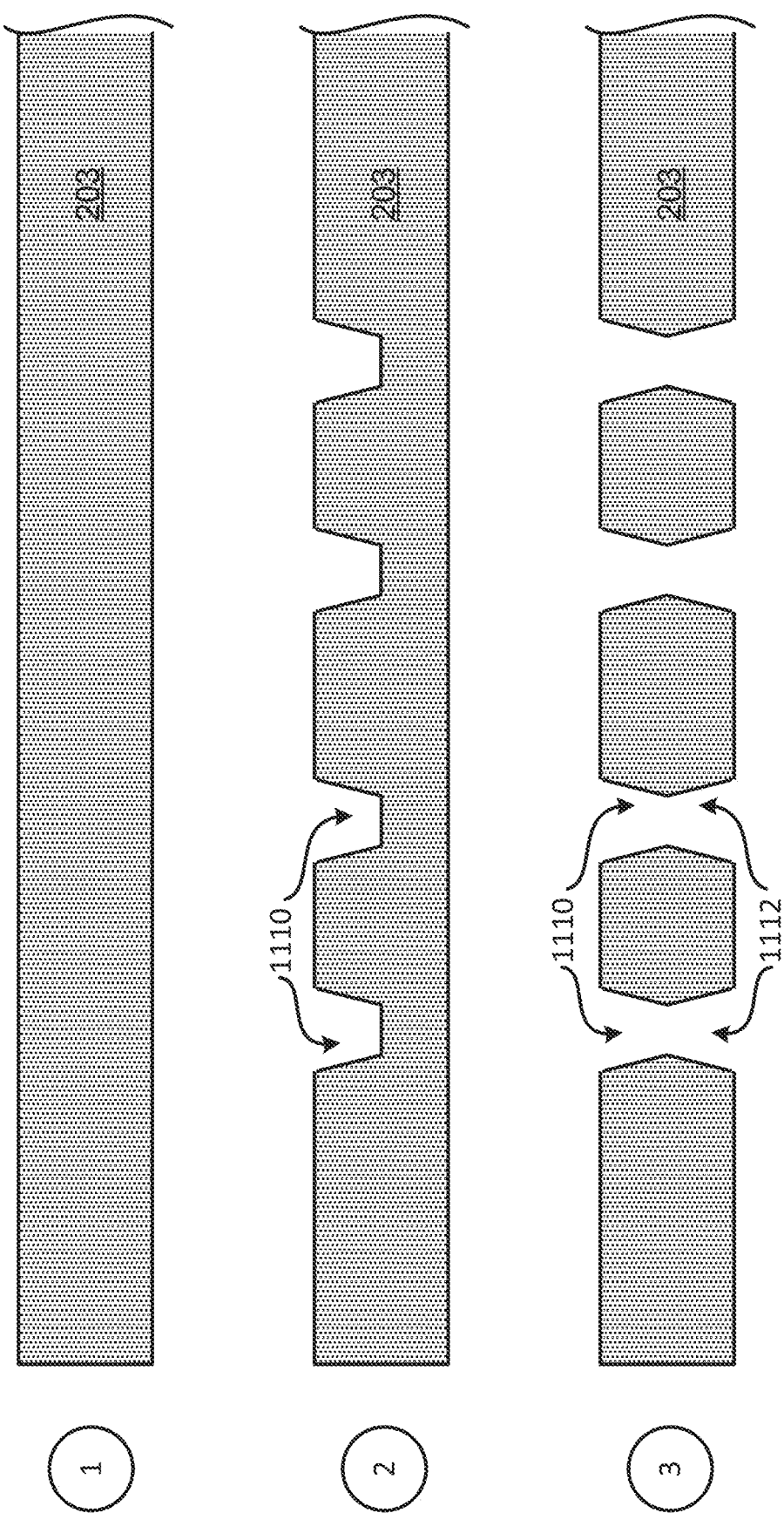
FIG. 11 (comprising FIGS. 11A-11B) illustrates an exemplary sequence for fabricating a substrate with a core layer.

In some implementations, fabricating a core substrate includes several processes. FIG. 11 (which includes FIGS. 11A-11B) illustrates an exemplary sequence for providing or fabricating a core substrate. In some implementations, the sequence of FIGS. 11A-11B may be used to provide or fabricate the substrate (e.g., 240) of FIG. 2. In some implementations, the sequence of FIGS. 11A-11B may be used when the core substrate has a core layer that is in a range of 150-250 micrometers (μm).

It should be noted that the sequence of FIGS. 11A-11B may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 11A, illustrates a core layer 203 being provided. The core layer 203 may include different dielectric materials, such a silicon, glass, quartz, epoxy, or combinations thereof.

Stage 2 illustrates a state after a plurality of cavities 1110 are formed through a first surface of the core layer 203. In some implementations, the cavities 1110 are formed using a laser process.

Stage 3 illustrates a state after a plurality of cavities 1112 are formed through a second surface (which may be opposite to the first surface) of the core layer 203. In some implementations, the cavities 1110 are formed using a laser process. The cavities 1112 may be formed such that they combine with the cavities 1110 to form cavities that completely travel through the core layer 203. As shown in stage 3, the combined cavities 1110 and 1112 have side walls that are angled or nonvertical relative to the first surface and the second surface of the core layer 203.

Stage 4, as shown in FIG. 11B, illustrates a state after a metal layer 500 (e.g., copper) is formed over the first surface and second surface of the core layer 203, and the surface of the cavities 1110 and 1112. A plating process may be used to form the metal layer 500. The metal layer 500 may include a seed layer and/or a metal layer. Thus, the metal layer 500 may include more than one metal layer.

Stage 5 illustrates a state after the metal layer 500 has been patterned to form and/or define interconnects (e.g., vias, traces, pads) for the core substrate. In some implementations, the core substrate may be the first substrate portion 240.

Exemplary Sequence for Fabricating a Core Substrate

Figure 12:
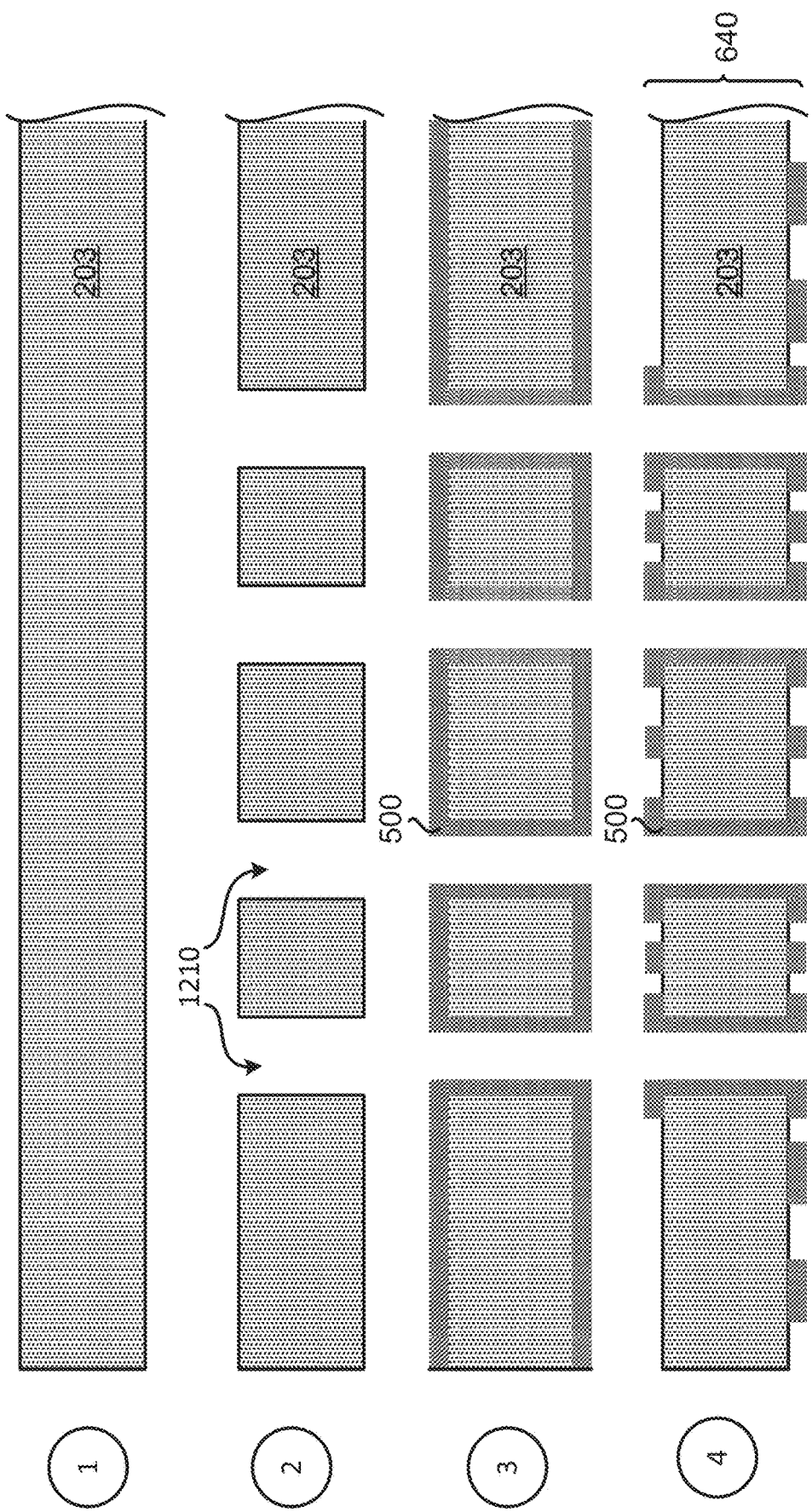
FIG. 12 illustrates an exemplary sequence for fabricating another substrate with a core layer.

FIG. 12 illustrates another exemplary sequence for providing or fabricating a core substrate. In some implementations, the sequence of FIG. 12 may be used to provide or fabricate the substrate (e.g., 640, 840) of FIG. 6 and/or FIG. 8. In some implementations, the sequence of FIG. 12 may be used when the core substrate has a core layer that a thickness in a range of 400-1200 micrometers (μm).

It should be noted that the sequence of FIG. 12 may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1 illustrates a core layer 203 being provided. The core layer 203 may include different dielectric materials, such a silicon, glass, quartz, epoxy, or combinations thereof.

Stage 2 illustrates a state after a plurality of cavities 1210 is formed through the core layer 203. In some implementations, the cavities 1210 are formed using a drilling process (e.g., mechanical drilling). The cavities 1210 may be formed such that the cavities have side walls that approximately vertical to a first surface and/or a second surface of the core layer 203.

Stage 3 illustrates a state after a metal layer 500 (e.g., copper) is formed over the first surface and second surface of the core layer 203, and the surface of the cavities 1210. A plating process may be used to form the metal layer 500. The metal layer 500 may include a seed layer and/or a metal layer. Thus, the metal layer 500 may include more than one metal layer.

Stage 4 illustrates a state after the metal layer 500 has been patterned to form and/or define interconnects (e.g., vias, traces, pads) for the core substrate. In some implementations, the core substrate may be the first substrate portion 640 or the first substrate portion 840.

Exemplary Flow Diagram of a Method for Fabricating a Core Substrate

Figure 13:
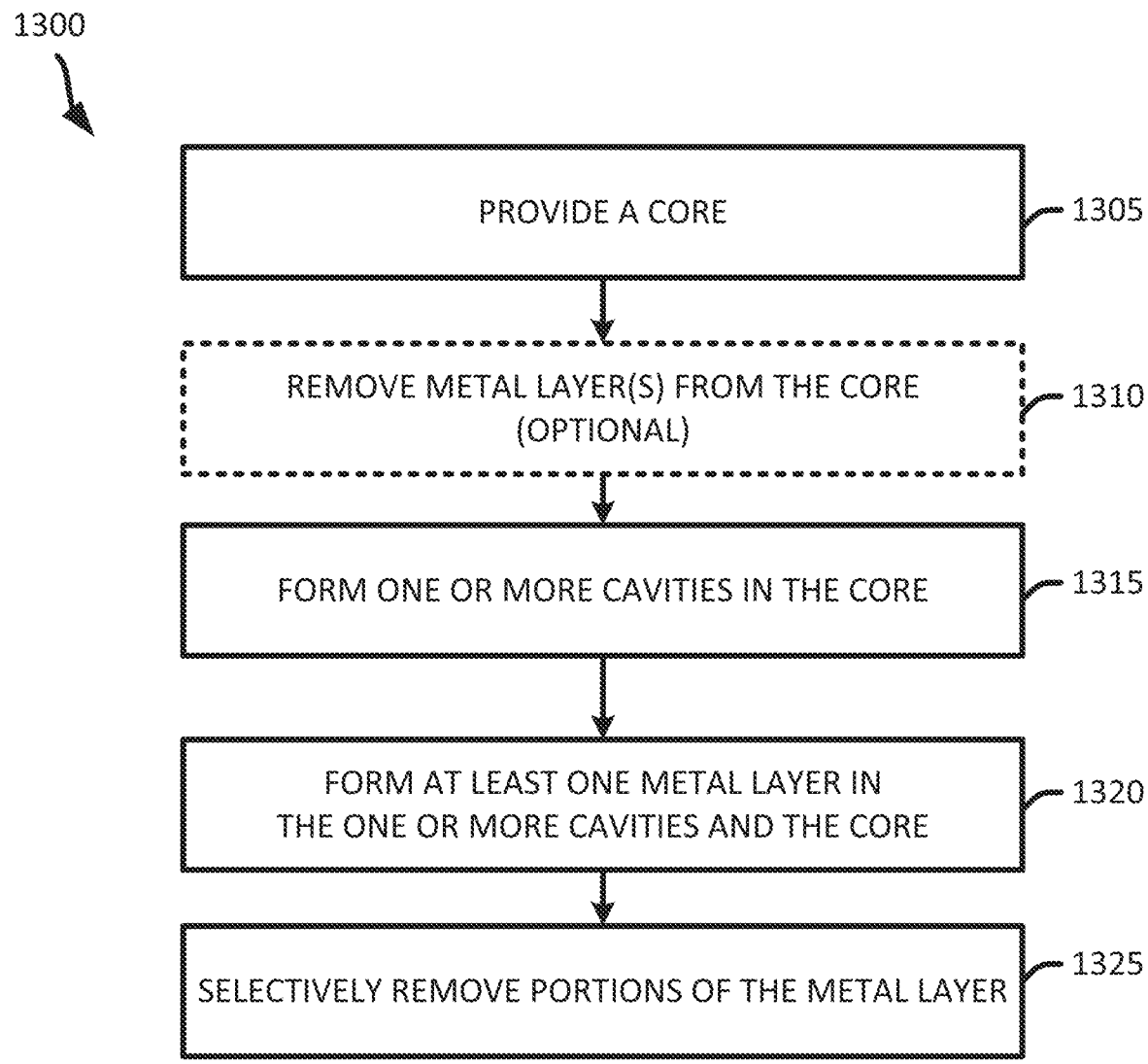
FIG. 13 illustrates an exemplary flow diagram of a method for fabricating a substrate with a core layer.

In some implementations, fabricating a core substrate includes several processes. FIG. 13 illustrates an exemplary flow diagram of a method 1300 for providing or fabricating a core substrate. In some implementations, the method 1300 of FIG. 13 may be used to provide or fabricate the core substrate of FIG. 6 and/or FIG. 8 described in the present disclosure. For example, the method of FIG. 13 may be used to fabricate the first substrate portion 640 and/or 840.

It should be noted that the sequence of FIG. 13 may combine one or more processes in order to simplify and/or clarify the method for providing or fabricating a core substrate. In some implementations, the order of the processes may be changed or modified.

The method 1300 provides (at 1305) a core layer 203. The core layer 203 may include different dielectric materials, such a silicon, glass, quartz, epoxy, or combinations thereof.

The method 1300 may optionally remove (at 1310) metal layers over the core layer 203. In some implementations, the core layer 203 may come with one or more metal layers formed over the first and/or second surfaces of the core layer 203. In such instances, the metal layer may be removed (e.g., by using an etching process).

The method forms (at 1315) a plurality of cavities through the core layer 203. The plurality of cavities (e.g., 1110, 1112, 1210) may be formed using a laser process or a drilling process, as described in FIGS. 11A-11B and 12.

The method forms (at 1320) a metal layer (e.g., 500) over the first surface and second surface of the core layer 203, and the surface of the cavities (e.g., 1110, 1112, 1210). A plating process may be used to form the metal layer. The metal layer may include a seed layer and/or a metal layer.

The method selectively removes (at 1325) portions of the metal layer (e.g., 500). Stage 5 illustrates a state after the metal layer (e.g., 500) has been patterned to form and/or define interconnects (e.g., vias, traces, pads) for the core substrate. In some implementations, the core substrate may be the first substrate portion 640 or the first substrate portion 840.

Exemplary Sequence for Fabricating a Coreless Substrate

Figure 14A:
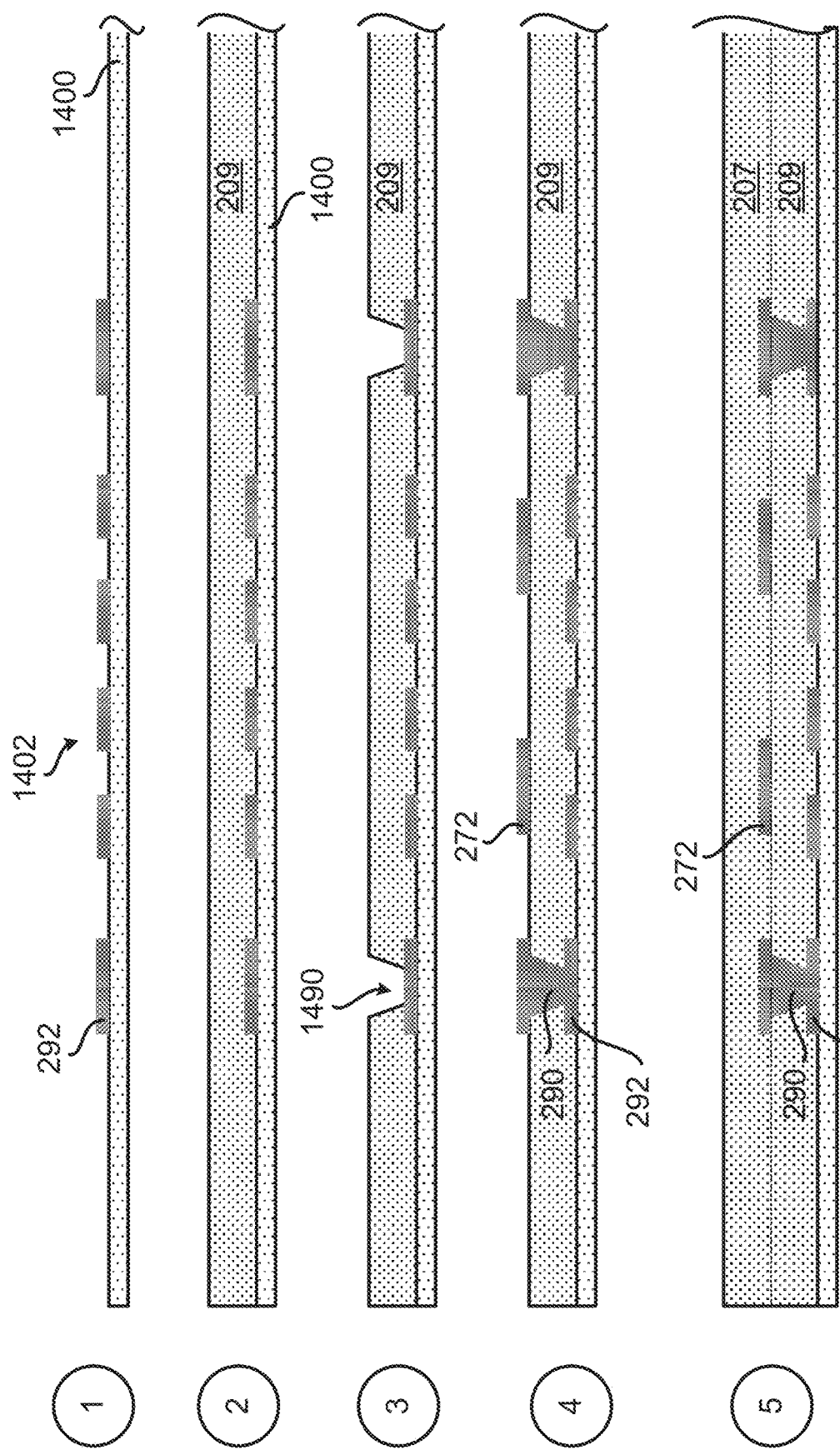
FIG. 14 (comprising FIGS. 14A-14B) illustrates an exemplary sequence for fabricating a coreless substrate.
Figure 14B:
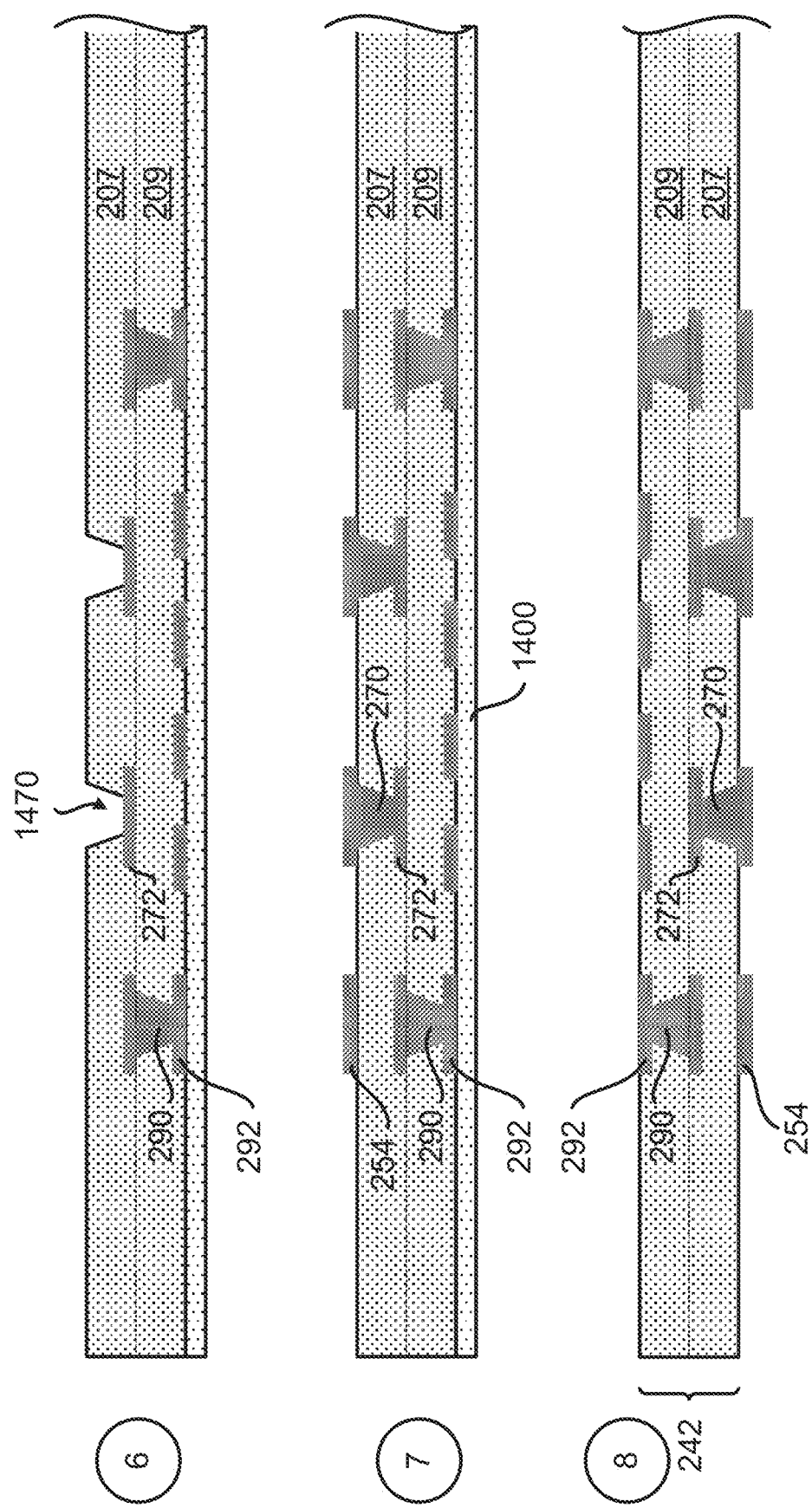

In some implementations, fabricating a coreless substrate includes several processes. FIG. 14 (which includes FIGS. 14A-14B) illustrates an exemplary sequence for providing or fabricating a coreless substrate. In some implementations, the sequence of FIGS. 14A-14B may be used to provide or fabricate the coreless substrate (e.g., 242) of FIG. 2, FIG. 6 and/or FIG. 8.

It should be noted that the sequence of FIGS. 14A-14B may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 14A, illustrates a state after a carrier 1400 is provided and a metal layer is formed over the carrier 1400. The metal layer may be patterned to form interconnects, such as pad 292. A plating process may be used to form the metal layer and interconnects.

Stage 2 illustrates a state after a dielectric layer 209 is formed over the carrier 1400 and the interconnects. The dielectric layer 209 may include polyimide.

Stage 3 illustrates a state after a plurality of cavities 1490 is formed in the dielectric layer 209. The plurality of cavities 1490 may be formed using an etching process or laser process.

Stage 4 illustrates a state after interconnects are formed in and over the dielectric layer 209. For example, the via 290 and the pad 272 are formed. A plating process may be used to form the interconnects.

Stage 5 illustrates a state after another dielectric layer 207 is formed over the dielectric layer 209.

Stage 6, as shown in FIG. 14B, illustrates a state after a plurality of cavities 1470 is formed in the dielectric layer 207. An etching process or laser process may be used to form the cavities 1470.

Stage 7 illustrates a state after interconnects are formed in and over the dielectric layer 207. For example, the via 270 and the pad 254 are formed. A plating process may be used to form the interconnects.

Stage 8 illustrates after the carrier 1400 is decoupled (e.g., removed, grinded out) from the dielectric layer 209, leaving the coreless substrate. In some implementation, the coreless substrate is an embedded trace substrate (ETS). In some implementations, the coreless substrate is the second substrate portion 242.

Exemplary Flow Diagram of a Method for Fabricating a Core Substrate

Figure 15:
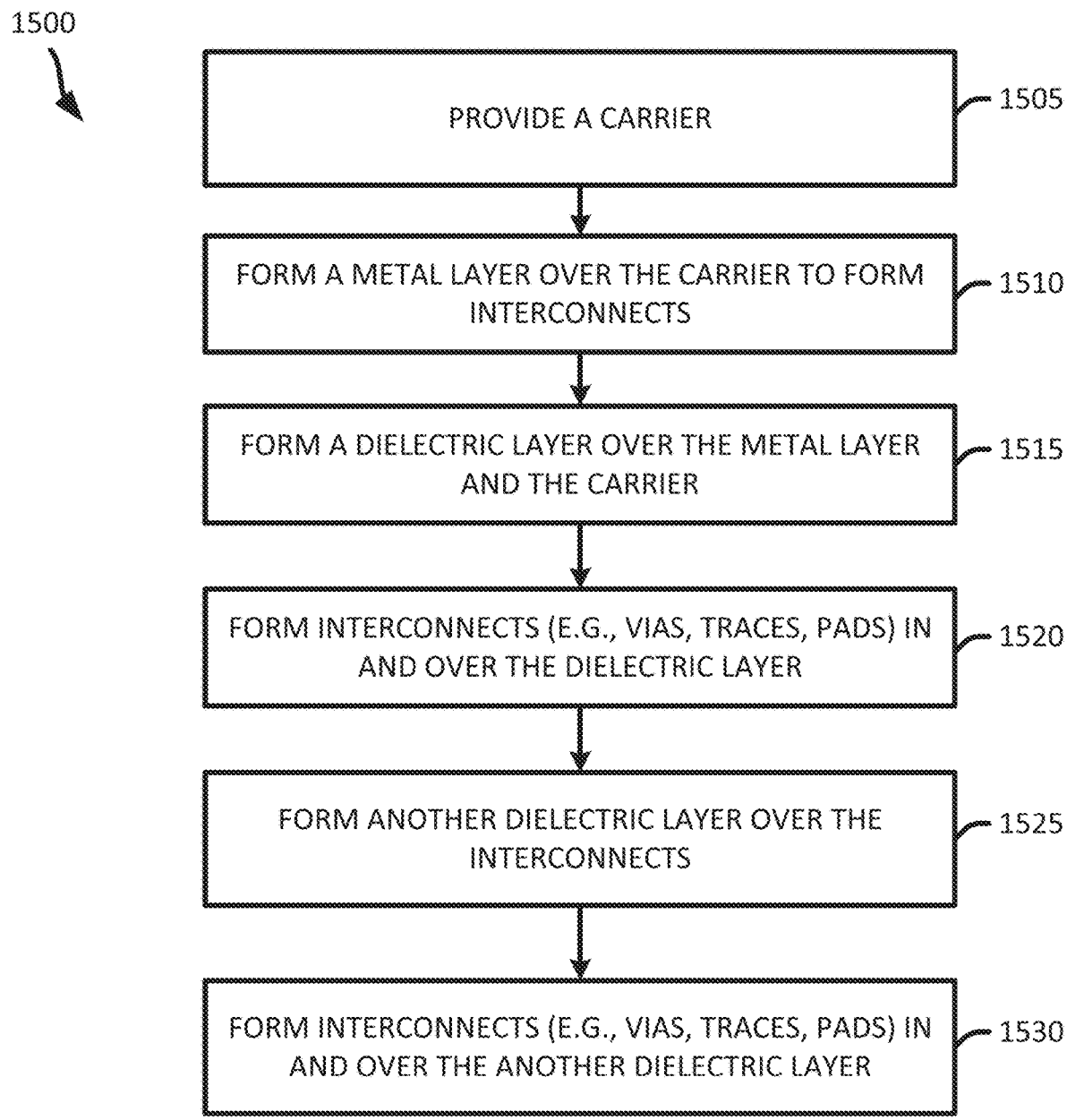
FIG. 15 illustrates an exemplary flow diagram of a method for fabricating a coreless substrate.

In some implementations, fabricating a coreless substrate includes several processes. FIG. 15 illustrates an exemplary flow diagram of a method 1500 for providing or fabricating a coreless substrate. In some implementations, the method 1500 of FIG. 15 may be used to provide or fabricate the coreless substrate of FIG. 2, FIG. 6 and/or FIG. 8 described in the present disclosure. For example, the method of FIG. 15 may be used to fabricate the second substrate portion 242.

It should be noted that the sequence of FIG. 15 may combine one or more processes in order to simplify and/or clarify the method for providing or fabricating a coreless substrate. In some implementations, the order of the processes may be changed or modified.

The method provides (at 1505) a carrier 1400. The method forms (at 1510) a metal layer over the carrier 1400. The metal layer may be patterned to form interconnects, such as pad 292. A plating process may be used to form the metal layer and interconnects.

The method forms (at 1515) a dielectric layer 209 over the carrier 1400 and the interconnects. The dielectric layer 209 may include polyimide. Forming the dielectric layer may also include forming a plurality of cavities (e.g., 1490) in the dielectric layer 209. The plurality of cavities may be formed using an etching process or laser process.

The method forms (at 1520) interconnects in and over the dielectric layer. For example, the via 290 and the pad 272 may formed. A plating process may be used to form the interconnects. Forming interconnects may include providing a patterned metal layer over and/or in the dielectric layer.

The method forms (at 1525) a dielectric layer 207 over the dielectric layer 209 and the interconnects. The dielectric layer 207 may include polyimide. Forming the dielectric layer may also include forming a plurality of cavities (e.g., 1470) in the dielectric layer 207. The plurality of cavities may be formed using an etching process or laser process.

The method forms (at 1530) interconnects in and/or over the dielectric layer. For example, the via 270 and the pad 254 may formed. A plating process may be used to form the interconnects. Forming interconnects may include providing a patterned metal layer over an in the dielectric layer.

The method may also decouple (e.g., removed, grinded out) the carrier (e.g., 1400) from the dielectric layer 209, leaving the coreless substrate. In some implementation, the coreless substrate is an embedded trace substrate (ETS). In some implementations, the coreless substrate is the second substrate portion 242.

Exemplary Electronic Devices

Figure 16:
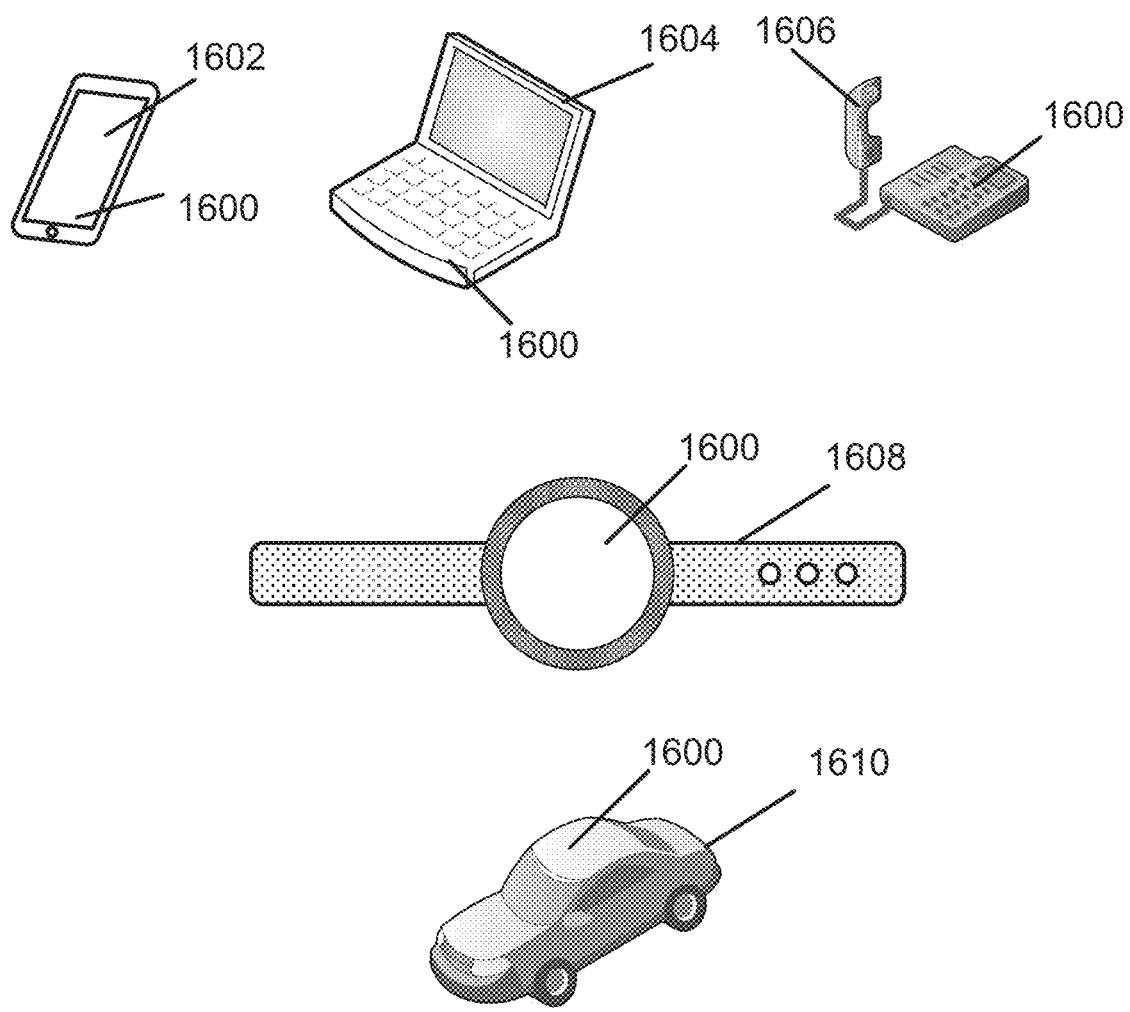
FIG. 16 illustrates various electronic devices that may integrate a die, a wafer, an integrated device, an integrated passive device (IPD), a device package, a package, an integrated circuit and/or a PCB described herein.

FIG. 16 illustrates various electronic devices that may be integrated with any of the aforementioned device, integrated device, integrated circuit (IC) package, integrated circuit (IC) device, semiconductor device, integrated circuit, die, interposer, package or package-on-package (PoP). For example, a mobile phone device 1602, a laptop computer device 1604, a fixed location terminal device 1606, a wearable device 1608, or automotive vehicle 1610 may include a device 1600 as described herein. The device 1600 may be, for example, any of the devices and/or integrated circuit (IC) packages described herein. The devices 1602, 1604, 1606 and 1608 and the vehicle 1610 illustrated in FIG. 16 are merely exemplary. Other electronic devices may also feature the device 1600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-4, 5A-5D, 6, 7A-7F, 10, 11A-11B, 12, 13, 14A-14B and/or 15-16 may be rearranged and/or combined into a single component, process, feature or function or embodied in several components, processes, or functions. Additional elements, components, processes, and/or functions may also be added without departing from the disclosure. It should also be noted FIGS. 2-4, 5A-5D, 6, 7A-7F, 10, 11A-11B, 12, 13, 14A-14B and/or 15-16 and its corresponding description in the present disclosure is not limited to dies and/or ICs. In some implementations, FIGS. 2-4, 5A-5D, 6, 7A-7F, 10, 11A-11B, 12, 13, 14A-14B and/or 15-16 and its corresponding description may be used to manufacture, create, provide, and/or produce devices and/or integrated devices. In some implementations, a device may include a die, a wafer, an integrated device, an integrated passive device (IPD), a die package, an integrated circuit (IC) device, a device package, an integrated circuit (IC) package, a semiconductor device, a package-on-package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately", as used in the disclosure shall mean within 10 percent of the 'value X'. For example, a value of about 1 or approximately 1, would mean a value in a range of 0.9-1.1.

In some implementations, the height of the device and/or package may be defined along the Z-direction of the package, which is shown in the figures of the present disclosure. In some implementations, the Z-direction of the device and/or package may be defined along an axis between a top portion and a bottom portion of the device and/or package. The terms top and bottom may be arbitrarily assigned, however as an example, the top portion of the device and/or package may be a portion comprising an encapsulation layer, while a bottom portion of the package may be a portion comprising a redistribution portion or a plurality of solder balls. In some implementations, the top portion of the package may be a back side of the package, and the bottom portion of the package may be a front side of the package. The front side of the package may be an active side of the package. A top portion may be a higher portion relative to a lower portion. A bottom portion may be a lower portion relative to a higher portion.

The X-Y directions or the X-Y plane of the device and/or package may refer to the lateral direction and/or footprint of the device and/or package. Examples of X-Y directions are shown in the figures of the present disclosure. The width, length and/or diameter of an object may refer to dimension (s) along the X-Y dimensions and/or the X-Y plane. In many of the figures of the present disclosure, the devices and/or packages and their respective components are shown across a X-Z cross-section or X-Z plane. However, in some implementations, the packages and their representative components may be represented across a Y-Z cross-section or Y-Z plane.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a die; and
   a substrate coupled to the die, the substrate including:
   (i) a core substrate portion including:
      a core layer having a first core surface; and
      a plurality of core substrate interconnects, each core substrate interconnect having a first minimum width, wherein the plurality of core substrate interconnects includes a plurality of surface core substrate interconnects formed over the first surface of core layer;
   (ii) a coreless substrate portion including:
      (i) a first dielectric layer having a first dielectric surface, the first dielectric surface facing the first core surface of the core layer; and
      (ii) a plurality of substrate interconnects, each substrate interconnect having a second minimum width, the second minimum width is less than the first minimum width, wherein the plurality of substrate interconnects includes a plurality of interconnects formed over the first dielectric surface; and
   (iii) a second dielectric layer formed between the core substrate portion and the coreless substrate portion such that the plurality of surface core substrate interconnects and the plurality of substrate interconnects are located in the second dielectric layer.

2. The integrated device of claim 1, wherein the second dielectric layer includes a plurality of vias, wherein the plurality of vias is coupled to (i) the plurality of surface core substrate interconnects, and (ii) the plurality of interconnects formed over the first dielectric layer.

3. The integrated device of claim 1, wherein each core substrate interconnect has a first minimum width of approximately 15 micrometers (μm), and each substrate interconnect has a second minimum width of approximately 6 micrometers (μm).

4. The integrated device of claim 3, wherein a minimum spacing between two neighboring core substrate interconnects is at least approximately 10 micrometers (μm), and a minimum spacing between two neighboring substrate interconnects is at least approximately 8 micrometers (μm).

5. The integrated device of claim 1, wherein the plurality of core substrate interconnects includes a plurality of core vias that travel through the core layer.

6. The integrated device of claim 5, wherein at least one core via includes (i) a metal layer, and (ii) a non-electrically conductive plug material that is laterally surrounded by the metal layer.

7. The substrate of claim 5, wherein walls of the plurality of core vias are approximately vertical.

8. The integrated device of claim 1, wherein the coreless substrate portion includes an embedded trace substrate (ETS).

9. The integrated device of claim 1, wherein the core layer has a thickness in a range of approximately 150-1200 micrometers (μm).

10. The integrated device of claim 1, wherein the integrated device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

11. A substrate comprising:
  (i) a first substrate portion including:
    a core layer having a first core surface; and
    a plurality of core substrate interconnects, each core substrate interconnect having a first minimum width, wherein the plurality of core substrate interconnects includes a plurality of surface core substrate interconnects formed over the first core surface of the core layer;
  (ii) a second substrate portion including:
    (i) a first dielectric layer having a first dielectric surface, the first dielectric surface facing the first core surface of the core layer; and
    (ii) a plurality of substrate interconnects, each substrate interconnect having a second minimum width, the second minimum width is less than the first minimum width, wherein the plurality of substrate interconnects includes a plurality of interconnects formed over the first dielectric surface; and
  (iii) a second dielectric layer formed between the first substrate portion and the second substrate portion such that the plurality of surface core substrate interconnects and the plurality of substrate interconnects are located in the second dielectric layer.

12. The substrate of claim 11, wherein the second dielectric layer includes a plurality of vias, wherein the plurality of vias is coupled to (i) the plurality of surface core substrate interconnects, and (ii) the plurality of interconnects formed over the first dielectric layer.

13. The substrate of claim 11, wherein each core substrate interconnect has a first minimum width of approximately 15 micrometers (μm), and each substrate interconnect has a second minimum width of approximately 6 micrometers (μm).

14. The substrate of claim 13, wherein a minimum spacing between two neighboring core substrate interconnects is at least approximately 10 micrometers (μm), and a minimum spacing between two neighboring substrate interconnects is at least approximately 8 micrometers (μm).

15. The substrate of claim 11, wherein the plurality of core substrate interconnects includes a plurality of core vias that travel through the core layer.

16. The substrate of claim 15, wherein at least one core via includes (i) a metal layer, and (ii) a non-electrically conductive plug material that is laterally surrounded by the metal layer.

17. The substrate of claim 15, wherein walls of the plurality of core vias are approximately vertical.

18. The substrate of claim 11, wherein the first substrate portion includes a core substrate and the second substrate portion includes an embedded trace substrate (ETS).

19. The substrate of claim 11, wherein the core layer has a thickness in a range of approximately 150-1200 micrometers (μm).

20. The substrate of claim 11, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

21. A method for fabricating a substrate, comprising:
  providing a core substrate that includes:
    (i) a core layer having a first core surface; and
    (ii) a plurality of core substrate interconnects, each core substrate interconnect having a first minimum width, wherein the plurality of core substrate interconnects includes a plurality of surface core substrate interconnects formed over the first core surface of the first core layer;
  providing a second dielectric layer over the core substrate; and
  providing an embedded trace substrate (ETS) over the second dielectric layer and the core substrate such that the second dielectric layer is between the core substrate and the ETS, wherein the ETS includes:
    (i) a first dielectric layer having a first dielectric surface, the first dielectric surface facing the first core surface of the core layer; and
    (ii) a plurality of substrate interconnects, each substrate interconnect having a second minimum width, the second minimum width is less than the first minimum width,
    wherein the plurality of substrate interconnects includes a plurality of interconnects formed over the first dielectric surface,
    wherein the plurality of surface core substrate interconnects and the plurality of substrate interconnects are located in the second dielectric layer.

22. The method of claim 21, wherein the second dielectric layer includes a plurality of vias, wherein the plurality of vias is coupled to (i) the plurality of surface core substrate interconnects, and (ii) the plurality of interconnects formed over the first dielectric layer.

23. The method of claim 21, wherein each core substrate interconnect has a first minimum width of approximately 15 micrometers (μm), and each substrate interconnect has a second minimum width of approximately 6 micrometers (μm).

24. The method of claim 23, wherein a minimum spacing between two neighboring core substrate interconnects is at least approximately 10 micrometers (μm), and a minimum spacing between two neighboring substrate interconnects is at least approximately 8 micrometers (μm).

25. The method of claim 21, wherein the plurality of core substrate interconnects includes a plurality of core vias that travel through the core layer.

26. The method of claim 25, wherein at least one core via includes (i) a metal layer, and (ii) a non-electrically conductive plug material that is laterally surrounded by the metal layer.

27. The method of claim 26, wherein a surface of the non-electrically conductive plug material is free of the metal layer.

28. The method of claim 25, wherein walls of the plurality of core vias are approximately vertical.

29. The method of claim 21, wherein the core layer has a thickness in a range of approximately 150-1200 micrometers (μm).

30. The method of claim 21, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

* * * * *